(12) United States Patent
Jang et al.

(10) Patent No.: US 10,424,691 B2
(45) Date of Patent: Sep. 24, 2019

(54) DISPLAY APPARATUS HAVING QUANTUM DOT UNIT OR QUANTUM DOT SHEET AND METHOD FOR MANUFACTURING QUANTUM DOT UNIT

(71) Applicant: SAMSUNG ELECTRONICS CO., LTD., Suwon-si (KR)

(72) Inventors: Nae-Won Jang, Seongnam-si (KR); Jean Hur, Seongnam-si (KR); Tae Soon Park, Hwaseong-si (KR); Jun-Mo Yoo, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/711,290

(22) Filed: Sep. 21, 2017

(65) Prior Publication Data

US 2018/0158983 A1 Jun. 7, 2018

(30) Foreign Application Priority Data

Dec. 5, 2016 (KR) .......................... 10-2016-0164135

(51) Int. Cl.
*H01L 33/06* (2010.01)
*G02F 1/1335* (2006.01)
(Continued)

(52) U.S. Cl.
CPC ................ *H01L 33/06* (2013.01); *B32B 7/12* (2013.01); *B32B 27/08* (2013.01); *F21K 9/64* (2016.08); *G02F 1/133603* (2013.01); *G02F 1/133615* (2013.01); *G02F 1/133621* (2013.01); *G09F 13/22* (2013.01); *G09F 13/42* (2013.01); *H01L 33/28* (2013.01); *B32B 2255/10* (2013.01);
(Continued)

(58) Field of Classification Search
CPC ..... H01L 33/06; G09F 13/22; G02F 1/133603
See application file for complete search history.

(56) References Cited

U.S. PATENT DOCUMENTS 6,978,070 B1 12/2005 McCarthy et al.
2005/0157996 A1* 7/2005 McCarthy .............. B82Y 20/00
385/123

(Continued)

FOREIGN PATENT DOCUMENTS

JP 2014017459 A 1/2014
JP 201692271 A 5/2016

(Continued)

OTHER PUBLICATIONS

Communication dated May 4, 2018, issued by the European Patent Office in counterpart European Application No. 17195842.4.

(Continued)

*Primary Examiner* — Jay C Chang
*Assistant Examiner* — Mikka Liu
(74) *Attorney, Agent, or Firm* — Sughrue Mion, PLLC

(57) ABSTRACT

There is provided a display apparatus and a method of manufacturing the same. The display apparatus includes: a quantum dot unit or a quantum dot sheet capable of improving heat dissipation performance. A wire with high heat transfer rate is provided in the quantum dot unit or the quantum dot sheet, and the wire is connected to the bottom chassis of the display apparatus so as to dissipate heat generated in the quantum dot.

16 Claims, 26 Drawing Sheets

(51) Int. Cl.
  *F21K 9/64*     (2016.01)
  *B32B 7/12*     (2006.01)
  *B32B 27/08*    (2006.01)
  *G09F 13/22*    (2006.01)
  *G09F 13/42*    (2006.01)
  *H01L 33/28*    (2010.01)

(52) U.S. Cl.
  CPC ............ *G02F 2001/133614* (2013.01); *G02F 2001/133628* (2013.01); *G02F 2202/36* (2013.01)

(56) References Cited

U.S. PATENT DOCUMENTS

| | | | |
|---|---|---|---|
| 2012/0256163 A1* | 10/2012 | Yoon | G02F 1/133603 257/13 |
| 2013/0050612 A1 | 2/2013 | Hur et al. | |
| 2013/0271700 A1 | 10/2013 | Nakamura et al. | |
| 2015/0028365 A1 | 1/2015 | Kurtin et al. | |
| 2015/0212260 A1 | 7/2015 | Li | |
| 2015/0219821 A1* | 8/2015 | Seo | G02B 6/0088 362/608 |
| 2015/0260906 A1 | 9/2015 | Li | |

FOREIGN PATENT DOCUMENTS

| | | |
|---|---|---|
| KR | 1020150104242 A | 9/2015 |
| KR | 10-2016-00955568 A | 8/2016 |

OTHER PUBLICATIONS

Communication issued Feb. 12, 2018 by the International Searching Authority in counterpart International Patent Application No. PCT/KR2017/011386. (PCT/ISA/210).

Communication dated Jan. 28, 2019, issued by the European Patent Office in counterpart European Application No. 17195842.4.

* cited by examiner

DISPLAY APPARATUS HAVING QUANTUM DOT UNIT OR QUANTUM DOT SHEET AND METHOD FOR MANUFACTURING QUANTUM DOT UNIT

CROSS-REFERENCE TO RELATED APPLICATION

This application claims priority from Korean Patent Application No. 10-2016-0164135, filed on Dec. 5, 2016 in the Korean Intellectual Property Office, the disclosure of which is incorporated herein by reference in its entirety.

BACKGROUND

1. Field

Apparatuses and methods consistent with one or more exemplary embodiments relate to a display apparatus including a quantum dot unit or a quantum dot sheet, and more particularly, to a quantum dot unit having a structure capable of improving heat dissipation performance, a quantum dot sheet including the same, and a display apparatus including the quantum dot unit or the quantum dot sheet.

2. Description of the Related Art

A display apparatus is an output device for presentation of data information, such as characters and figures, and an image in visual form.

A display apparatus may include a self-emissive display panel such as an organic light-emitting diode (OLED) or a light-receiving display panel such as a liquid crystal display (LCD).

A display apparatus provided with a light-receiving display panel may include a backlight unit to supply light to the display panel.

A related art display apparatus may have an improved color reproducibility by providing a quantum dot unit at one side of a backlight unit. A quantum dot refers to a semiconductor crystal having a nanometer size and manufactured by a chemical synthesis process. Smaller quantum dots emit light having shorter wavelengths and larger quantum dots emit light having longer wavelengths.

When a quantum dot unit is applied to a display apparatus, excellent color reproducibility may be realized with low manufacturing costs. However, due to the difficulty in directly controlling a temperature of the quantum dot unit caused by heat generation, an indirect heat dissipation method is used. Thus, efficiency of the quantum dot unit decreases at high temperature and design and performance of the backlight unit are limited. In addition, since a component for heat dissipation is added to the display apparatus including the quantum dot unit, it is difficult to provide a customer with a display apparatus having reasonable manufacturing costs.

SUMMARY

Aspects of one or more exemplary embodiments provide a quantum dot unit having a structure capable of improved heat dissipation performance with reasonable manufacturing costs, a quantum dot sheet including the same, and a display apparatus including the quantum dot unit or the quantum dot sheet.

Additional aspects will be set forth in part in the description which follows and, in part, will be obvious from the description, or may be learned by practice of the disclosure.

According to an aspect of an exemplary embodiment, there is provided a display apparatus including: a display panel; a light source configured to emit light; a light guide plate configured to guide the light emitted from the light source toward the display panel; and a quantum dot unit disposed on a light path between the light source and the display panel and including a plurality of quantum dots and at least one wire between the plurality of quantum dots.

The display apparatus may further include a chassis configured to support the quantum dot unit, wherein both ends of the at least one wire may be connected to the chassis.

The chassis may include a heat dissipation member and the both ends of the at least one wire may be connected to the heat dissipation member.

The quantum dot unit may further include a glass fiber having a hollow; the plurality of quantum dots may be accommodated in the hollow; and the at least one wire may have a length greater than a length of the glass fiber and may extend into the hollow to protrude from both ends of the glass fiber.

The quantum dot unit may further include a protection layer at the both ends of the glass fiber to prevent the plurality of quantum dots from being exposed.

The display apparatus may further include a plurality of quantum dot units, including the quantum dot unit, stacked in a thickness direction of the light guide plate.

The plurality of quantum dot units may be attached to each other by an adhesive member.

The display apparatus may further include a printed circuit board mounted with the light source and under the light guide plate in the thickness direction of the light guide plate; a middle mold configured to support the display panel, the middle mold including an intermediate support part on the light guide plate in the thickness direction of the light guide plate to face the printed circuit board with the light source therebetween; and a fixing member including: a first fixing member at the intermediate support part to fix a first quantum dot unit facing the intermediate support part among the plurality of quantum dot units, and a second fixing member installed at the printed circuit board to fix a second quantum dot unit facing the printed circuit board among the plurality of quantum dot units.

The display apparatus may further include a printed circuit board mounted with the light source and under the light guide plate in the thickness direction of the light guide plate; and a middle mold configured to support the display panel, the middle mold including an intermediate support part on the light guide plate in the thickness direction of the light guide plate to face the printed circuit board with the light source disposed therebetween, wherein at least one of the plurality of quantum dot units is fixed to at least one of the printed circuit board and the intermediate support part.

The display apparatus may further include a plurality of quantum dot units, including the quantum dot unit, wherein the plurality of quantum dot units may include: a first quantum dot unit including a first quantum dot configured to generate a first color; and a plurality of second quantum dot units each including a second quantum dot configured to generate a second color different from the first color and arranged along an outer circumference of the first quantum dot unit, and wherein the first quantum dot unit does not include the second quantum dot and the plurality of second quantum dot units do not include the first quantum dot.

The at least one wire may include a plurality of wires between the plurality of quantum dots.

The light guide plate may have a light-incident surface on which light emitted from the light source is incident; and the quantum dot unit may be between the light-incident surface and the light source.

The plurality of quantum dot units may be disposed to be spaced apart respectively from the light guide plate and the light source.

According to an aspect of another exemplary embodiment, there is provided a display apparatus including: a display panel; a light source configured to emit light to the display panel; an optical sheet above the light source; and a quantum dot sheet adjacent to the optical sheet and including a plurality of quantum dots and at least one wire between the plurality of quantum dots.

The display apparatus may further include a chassis configured to support the quantum dot sheet, wherein both ends of the at least one wire protruding from both ends of the quantum dot sheet may be connected to the chassis.

The chassis may include a heat dissipation member and the both ends of the at least one wire may be connected to the heat dissipation member.

The display apparatus may further include a diffuser plate between the display panel and the light source and configured to diffuse the light emitted from the light source and guide the light toward the display panel, wherein the quantum dot sheet may be between the optical sheet and the diffuser plate.

The quantum dot sheet may further include at least one quantum dot unit including a glass fiber having a hollow, the plurality of quantum dots may be accommodated in the hollow of the glass fiber, and the at least one wire may be aligned to penetrate the hollow of the glass fiber.

The at least one quantum dot unit may further include a protection layer at both ends of the glass fiber configured to prevent the plurality of quantum dots from being exposed.

According to an aspect of another exemplary embodiment, there is provided a method of manufacturing a quantum dot unit, the method including: providing a wire having a length greater than a length of a glass fiber in a hollow of the glass fiber; injecting a quantum dot resin including a quantum dot into the hollow of the glass fiber; curing the quantum dot resin; and forming a protection layer on the glass fiber to prevent the quantum dot from being exposed.

According to an aspect of an exemplary embodiment, there is provided a quantum dot unit for a display apparatus, the quantum dot unit including: a plurality of quantum dots accommodated in a hollow; and at least one wire extending between the plurality of quantum dots and configured to dissipate heat generated in the plurality of quantum dots.

The at least one wire may have a length greater than a length of the hollow and may protrude from both ends of the hollow.

The quantum dot unit may further include a glass fiber including the hollow.

The quantum dot unit may further include a protection layer at the both ends of the glass fiber to prevent the plurality of quantum dots from being exposed.

The at least one wire may include a plurality of wires between the plurality of quantum dots.

BRIEF DESCRIPTION OF THE DRAWINGS

These and/or other aspects will become apparent and more readily appreciated from the following description, taken in conjunction with the accompanying drawings of which.

DETAILED DESCRIPTION

Figure 1:
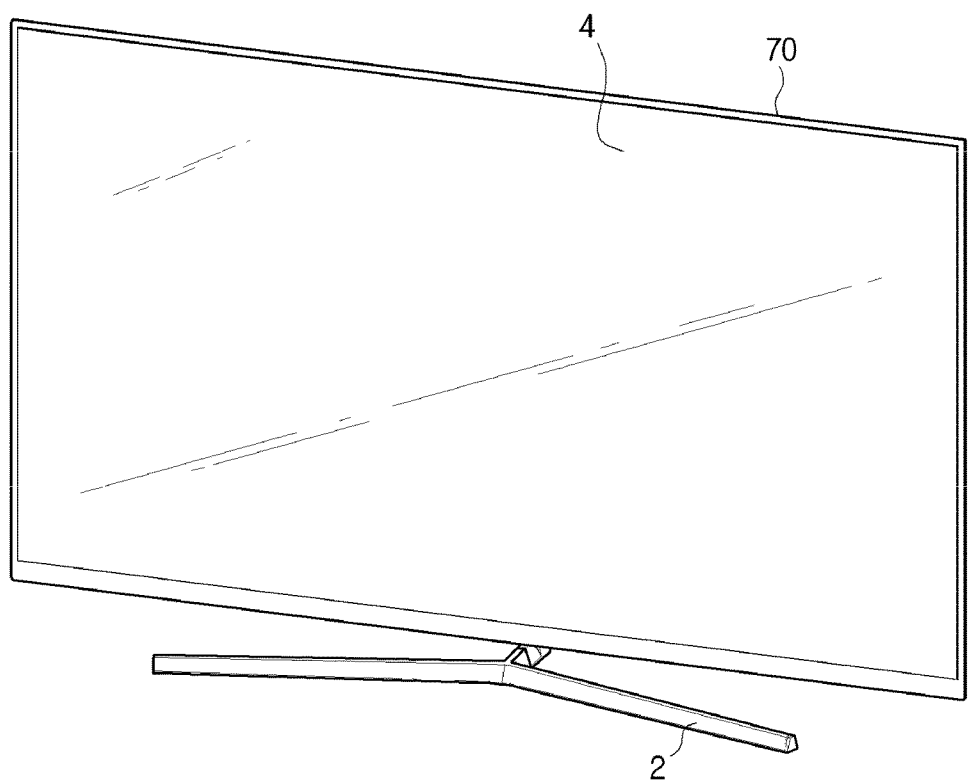
FIG. 1 is a view illustrating a display apparatus according to an exemplary embodiment.

Reference will now be made in detail to exemplary embodiments, examples of which are illustrated in the accompanying drawings, wherein like reference numerals refer to like elements throughout. The present disclosure may, however, be embodied in many different forms and should not be construed as being limited to exemplary embodiments set forth herein.

The terms used in the present specification are merely used to describe particular exemplary embodiments, and are not intended to limit the present disclosure. An expression used in the singular encompasses the expression of the plural, unless the context clearly indicates otherwise. Throughout the specification, it is to be understood that the terms such as "include" or "have" etc., are intended to indicate the existence of the features, numbers, operations, components, parts, or combinations thereof disclosed in the specification, and are not intended to preclude the possibility that one or more other features, numbers, operations, components, parts, or combinations thereof may exist or may be added.

It will be understood that, although the terms "first," "second," etc., may be used herein to describe various elements, these elements should not be limited by these terms. The above terms are used only to distinguish one component from another. For example, a first component discussed below could be termed a second component, and similarly, the second component may be termed the first component without departing from the teachings of this disclosure. As used herein, the term "and/or" and the term "at least one of" includes any and all combinations of one or more of the associated listed items.

Meanwhile, the terms used throughout the specification "front end," "rear end," "on," "under," "upper end," "lower end," and the like are defined based on the drawings and the shape and position of each element are not limited by these terms.

Hereinafter, exemplary embodiments will be described in detail with reference to the accompanying drawings.

Figure 2:
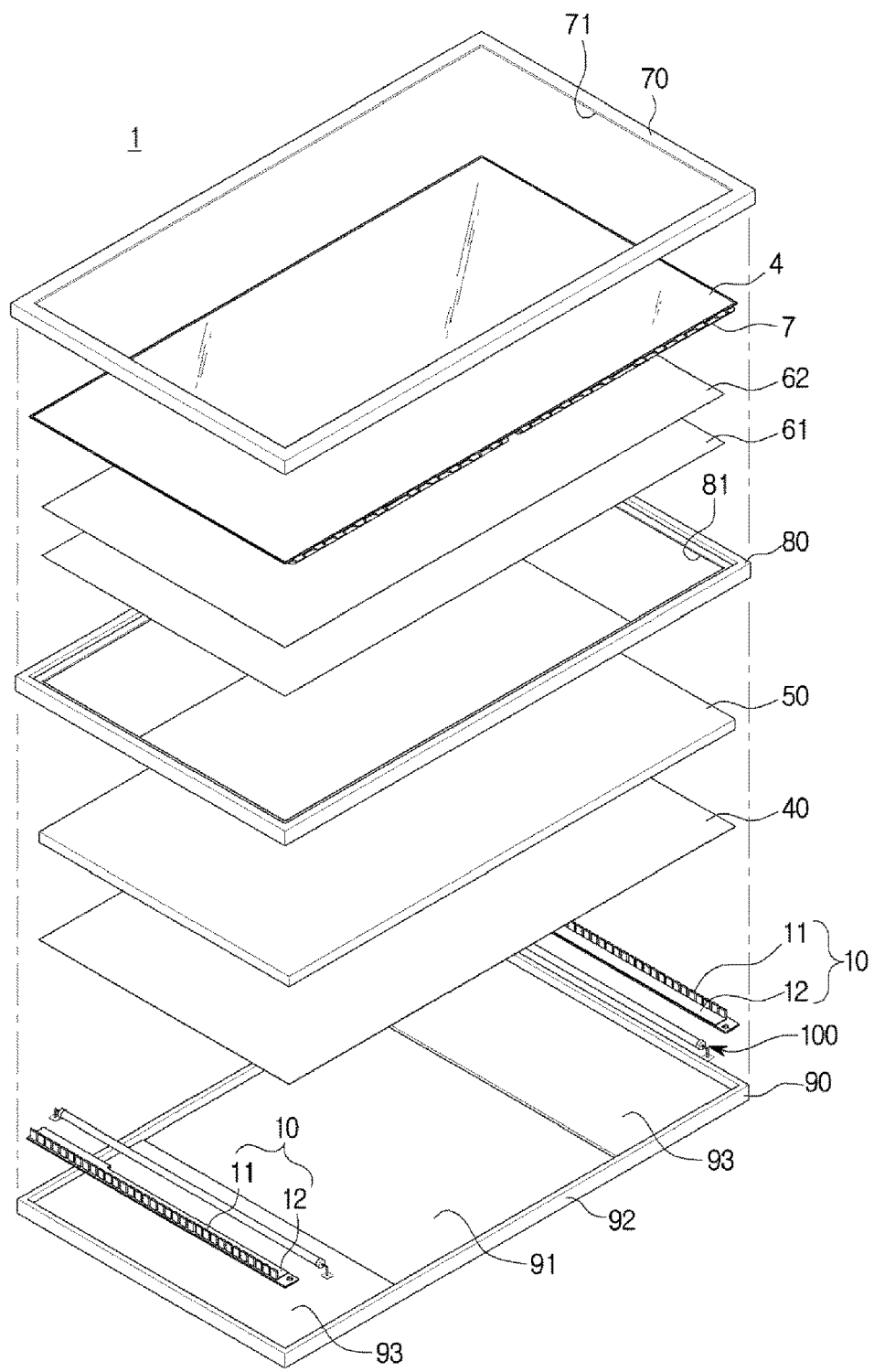
FIG. 2 is an exploded perspective view illustrating the display apparatus of FIG. 1.
Figure 3:
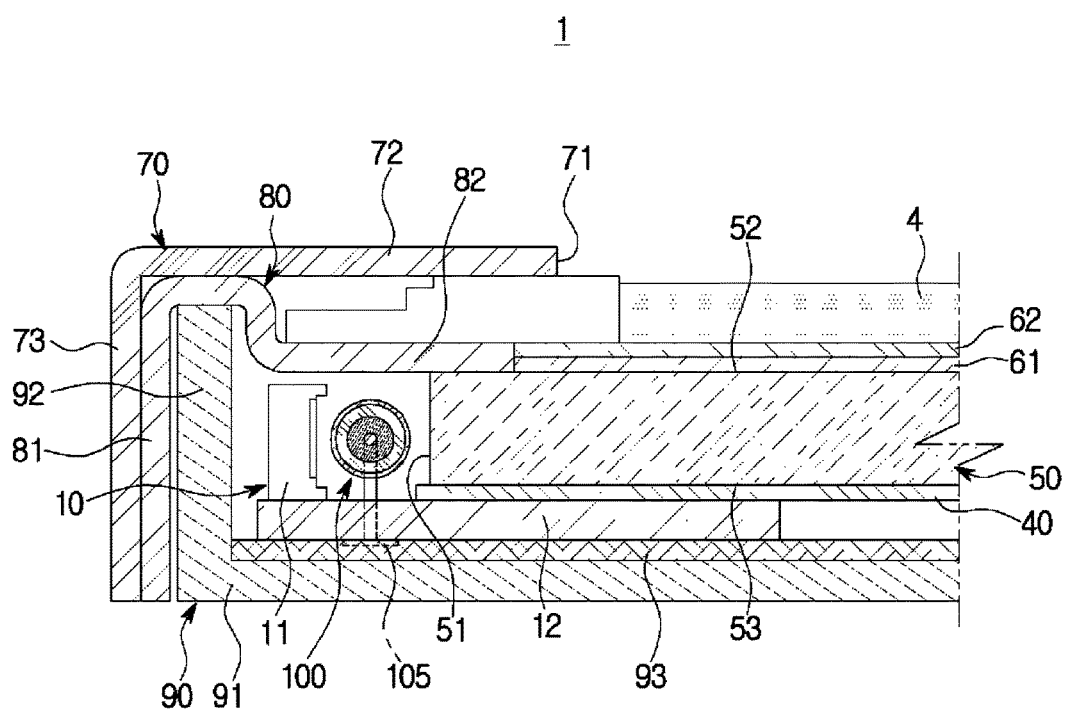
FIG. 3 is a partial cross-sectional view illustrating the display apparatus of FIG. 1.

FIG. 1 is a view illustrating a display apparatus 1 according to an exemplary embodiment. FIG. 2 is an exploded perspective view illustrating the display apparatus 1. FIG. 3 is a partial cross-sectional view illustrating the display apparatus 1.

A display apparatus 1 is an apparatus to display information, data, and the like in the form of characters, figures, graphs, and/or images and includes a television which is a telecommunication medium for transmitting moving images and image signals and a monitor that is an output device of a computer.

The display apparatus 1 may be a flat display apparatus having a flat screen as illustrated in FIG. 1, a curved display apparatus having a curved screen, or a bendable display apparatus having a screen that is reversibly changeable between a flat shape and a curved shape or has a variable curvature.

The display apparatus 1 may include a display panel 4 configured to display an image as a display unit of the display apparatus 1 and a backlight unit (e.g., backlight) configured to emit light toward the display panel 4.

The display panel 4 may include a liquid crystal panel. The liquid crystal panel may display an image by using liquid crystals exhibiting different optical properties according to voltage and temperature. The liquid crystal panel may include a thin film transistor (TFT) substrate, a color filter substrate coupled to face the TFT substrate, and liquid crystals injected between the TFT substrate and the color filter substrate. The TFT substrate may be a transparent substrate in which TFTs, as switching devices, are provided in a matrix form. The color filter substrate may be a transparent substrate in which RGB color pixels, which are color pixels expressing predetermined colors, are formed by a thin film process.

The display panel 4 may be connected to a signal transmission film 7 to receive data driving signals and gate driving signals. The signal transmission film 7 may be provided in a chip on flexible printed circuit (COF) type in which a driving chip is mounted on a flexible circuit board.

The backlight unit may be disposed at a lower portion of the display panel 4 to emit light toward the display panel 4. However, it is understood that one or more other exemplary embodiments are not limited thereto, and the backlight unit may be provided at other locations relative to the display panel 4.

The backlight unit may be an edge-type in which a light source 11 is disposed on at least one side of a plurality of long sides and short sides of the display panel 4 according to the present exemplary embodiment. According to another exemplary embodiment, the backlight unit may be a direct-type in which the light source 11 is disposed directly behind the display panel 4.

The backlight unit may include a light source module 10, which includes the light source 11 and a printed circuit board 12 on which the light source 11 is mounted, and various optical members on a path of light emitted from the light source 11.

The light source 11 may include a light emitting diode (LED). The LED may be provided in the form of a package in which an LED chip is mounted on a substrate and filled with a resin. However, it is understood that one or more other exemplary embodiments are not limited thereto. For example, according to another exemplary embodiment, the light source 11 may include a cold cathode fluorescent lamp (CCFL) or an external electrode fluorescent lamp (EEFL).

A plurality of light sources 11 may be linearly mounted on the printed circuit board 12 along an edge of the display panel 4. The printed circuit board 12 may be provided with a circuit pattern or the like to transmit driving power and signals to the light source 11. The printed circuit board 12 may be seated or provided on a bottom chassis 90 which will be described below.

The optical members may be disposed on the path of light emitted from the light source 11 to guide a proceeding or emitting direction of light and/or to improve optical characteristics.

The optical members may include a reflector sheet 40 to prevent a loss of light by reflecting light, a light guide plate 50 to uniformly distribute light emitted from the light source 11 toward the display panel 4, and various optical sheets 61 and 62 to improve optical characteristics.

The reflector sheet 40 may reflect light emitted from the light source 11 to be incident on a bottom surface of the light guide plate 50. The reflector sheet 40 may be provided in various forms such as a sheet, a film, and a plate. For example, the reflector sheet 40 may be formed by coating a base material with a material having a high reflectance. Examples of the base material may be SUS (e.g., stainless steel), BRASS, aluminum, polyethylene terephthalate (PET), and the like, and examples of a highly reflective coating agent may be silver and titanium dioxide $TiO_2$.

The reflector sheet 40 may be seated on the printed circuit board 12 and supported thereby.

The light guide plate 50 may be formed of polymethyl methacrylate (PMMA). The light guide plate 50 may be provided with a pattern to change an optical path. In the edge-type backlight unit according to the present exemplary embodiment, the light source 11 may be disposed on one side of the light guide plate 50. Light incident on the side of the light guide plate 50 is scattered by a pattern formed on the bottom surface of the light guide plate 50 and emitted via a top surface of the light guide plate 50.

The light guide plate 50 may be seated or provided on the reflector sheet 40. The light guide plate 50 may be disposed such that one side of the light guide plate 50 is spaced apart from the light source 11 at a predetermined interval in consideration of thermal expansion.

The optical sheets 61 and 62 may be disposed on the light guide plate 50 to improve optical characteristics of light emitted from the light guide plate 50.

The optical sheets 61 and 62 may include, for example, a diffuser sheet 61 and a prism sheet 62.

The diffuser sheet 61 may offset or minimize the pattern of the light guide plate 50. Since light guided by the light guide plate 50 directly reaches eyes of a user, the user may see the pattern of the light guide plate 50. Thus, the diffuser sheet 61 may offset or minimize the pattern.

The prism sheet 62 may increase brightness of light which rapidly decreases while passing through the diffuser sheet 61 by concentrating the light. A dual brightness enhancement film (DBEF) that is a high brightness prism sheet, or the like may be used as the prism sheet 62.

According to another exemplary embodiment. the optical sheets may further or alternatively include a protection sheet to protect the optical sheets from external impact or foreign matters.

The optical sheets 61 and 62 may be disposed between the light guide plate 50 and the display panel 4.

The optical members may further include a quantum dot unit 100, 110, 120, 130, 140, or 150.

The quantum dot unit 100, 110, 120, 130, 140, or 150 may improve color reproducibility by changing wavelengths of light. Color reproducibility refers to a degree at which color of an object may be reproduced with fidelity and indicates an expressed area on color coordinates. The quantum dot unit 100, 110, 120, 130, 140, or 150 may be disposed on an optical path between the light source 11 and the display panel 4.

The quantum dot unit 100, 110, 120, 130, 140, or 150 may include a quantum dot 102. The quantum dot 102 may receive blue light and generate all colors of visible light according to the size thereof. Smaller quantum dots emit light having shorter wavelengths and larger quantum dots emit light having longer wavelengths.

The quantum dot units 100, 110, 120, 130, 140, and 150 will be described in more detail below.

The display apparatus 1 may further include a chassis assembly to accommodate and support the display panel 4 and the backlight unit.

The chassis assembly may include a top chassis 70, a middle mold 80, and a bottom chassis 90.

The top chassis 70 may have an opening 71 to expose the display panel 4, a bezel part 72 to support edges of the front surface of the display panel 4, and a top chassis side part 73 extending downward from the bezel part 72.

The middle mold 80 may include a middle mold side part 81 and an intermediate support part 82 protruding inward from the middle mold side part 81 to support the display panel 4 and the optical member and maintain intervals.

The bottom chassis 90 may include a bottom part 91 disposed under the backlight unit and a bottom side part 92 extending upward from the bottom part 91. The printed circuit board 12 of the light source module 10 may be seated or provided on the bottom part 91.

Various elements of the display apparatus 1 such as the top chassis 70 and the middle mold 80 may be fixedly supported by the bottom chassis 90.

The bottom chassis 90 may dissipate heat generated in the light source 11 to the outside. That is, heat generated in the light source 11 may be transferred to the bottom chassis 90 via the printed circuit board 12 and dissipated through the bottom chassis 90. To this end, the bottom chassis 90 may include a heat dissipation member 93 formed of various metallic materials having high thermal conductivity such as aluminum and SUS or plastic materials such as ABS. In addition, a metallic printed circuit board (PCB) formed of aluminum with high thermal conductivity may also be used as the printed circuit board 12.

However, it is understood that one or more other exemplary embodiments are not limited thereto. For example, according to another exemplary embodiment, the bottom chassis 90 may also be formed of various metallic materials having high thermal conductivity such as aluminum and SUS or plastic materials such as ABS without including the separate heat dissipation member 93. In addition, according to another exemplary embodiment, at least one of the top chassis 70, the middle mold 80, and the bottom chassis 90 may be omitted or integrated with each other.

The display apparatus 1 may further include a housing enclosing the chassis assembly to protect and accommodate the chassis assembly.

The display apparatus 1 may further include legs 2 to support the display apparatus 1 on an installation surface. The display apparatus 1 may be supported on a floor or other flat surface as illustrated in FIG. 1. In addition, the display apparatus 1 may be provided as a wall-mounted type or a built-in type installed in a wall.

Figure 4:
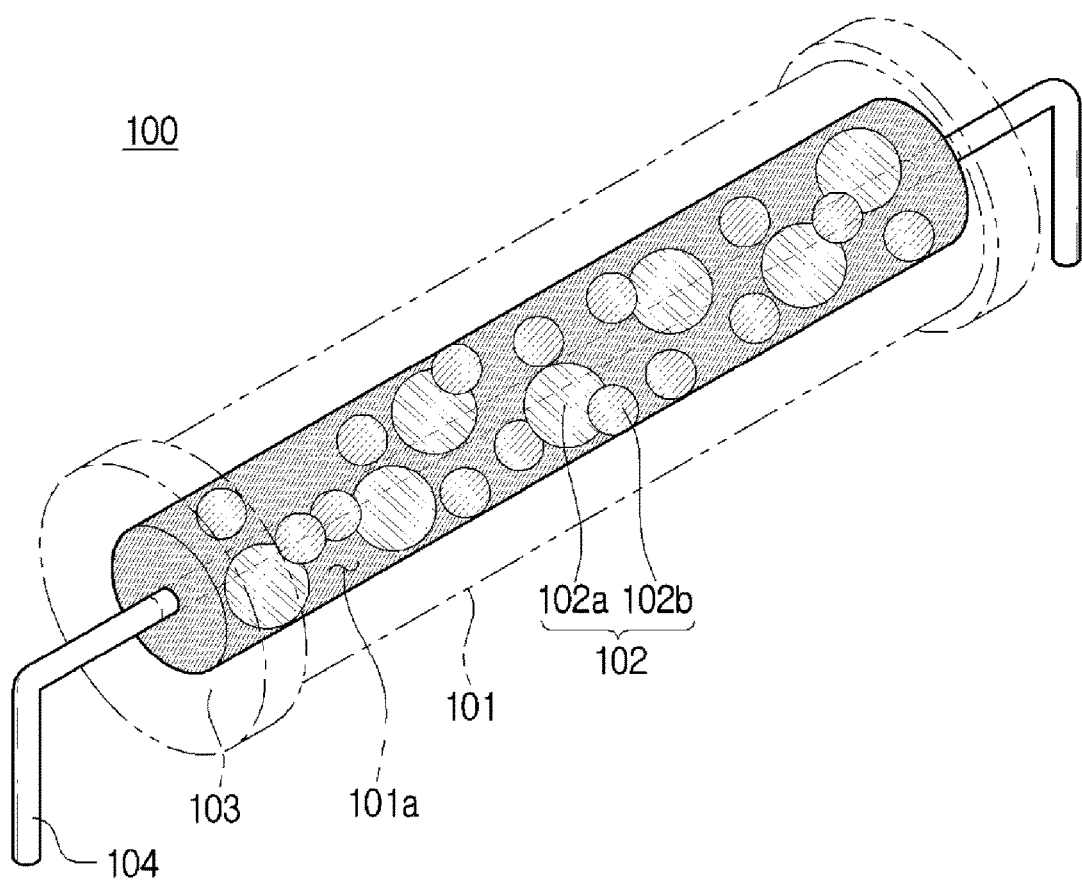
FIG. 4 is a view illustrating a quantum dot unit according to a first exemplary embodiment applicable to a display apparatus according to an exemplary embodiment.

FIG. 4 is a view illustrating a quantum dot unit 100 according to a first exemplary embodiment applicable to a display apparatus according to an exemplary embodiment.

The quantum dot unit 100 (e.g., quantum dot device or object) may have softness. The quantum dot unit 100 may include a glass fiber 101. The glass fiber 101 may have a hollow 101*a*. Particularly, the glass fiber 101 may have a tube shape with the hollow 101*a*. Although the glass fiber 101 may have a circular cross-section as illustrated in FIG. 4, the shape of the cross-section of the glass fiber 101 is not limited thereto in one or more other exemplary embodiments.

The quantum dot unit 100 may further include a plurality of quantum dots 102 accommodated in the hollow 101*a*. The quantum dots 102 may include various quantum dots generating various colors. For example, the quantum dots 102 may include a first quantum dot 102a generating red color and a second quantum dot 102b generating green color. As illustrated in FIG. 4, both the first quantum dot 102a and the second quantum dot 102b may be contained in the hollow 101a of the glass fiber 101.

The quantum dot unit 100 may further include a protection layer 103 configured to cover both ends of the glass fiber 101. The protection layer 103 may include at least one of an acrylic resin, a silicone resin, and an epoxy resin.

The quantum dots 102 are vulnerable to moisture or oxygen. For example, when the quantum dots 102 react with moisture or oxygen, optical characteristics of the quantum dots 102 may change. The glass fiber 101 may prevent the optical characteristics of the quantum dots 102 from changing by blocking moisture or oxygen. In addition, the protection layer 103 prevents the quantum dots 102 from being exposed at both ends of the glass fiber 101 to inhibit reactions with moisture or oxygen.

The protection layer 103 may also be provided to cover an outer circumferential surface of the glass fiber 101 in addition to the both ends of the glass fiber 101. The protection layer disposed on the outer circumferential surface of the glass fiber 101 prevents reactions between the quantum dots 102 and moisture or oxygen together with the glass fiber 101. In addition, the protection layer disposed on the outer circumferential surface of the glass fiber 101 serves to prevent occurrence of cracks in the glass fiber 101 when the quantum dot unit 100 is deformed.

The quantum dot unit 100 may further include a wire 104 inserted into the hollow 101a of the glass fiber 101. The wire 104 may be longer than the glass fiber 101 and protrude from both ends of the glass fiber 101. The wire 104 may include a metal having high thermal conductivity such as copper, gold, and silver. A thinner wire 104 may have higher light transmittance. Furthermore, the quantum dot unit 100 may include a plurality of wires 104 penetrating the hollow 101a of the glass fiber 101.

Figure 5:
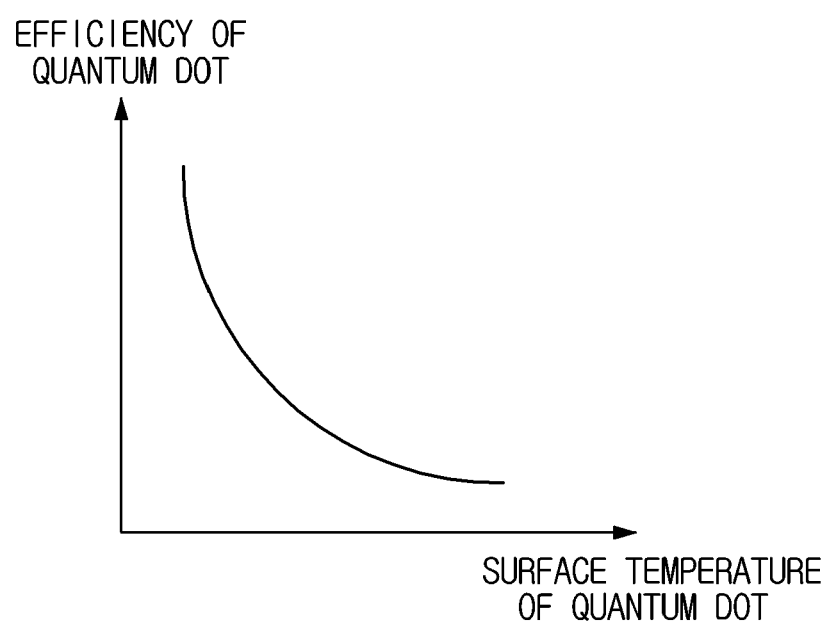
FIG. 5 is a graph illustrating the relationship between surface temperature of a quantum dot and efficiency of the quantum dot in a quantum dot unit or a quantum dot sheet applicable to a display apparatus according to an exemplary embodiment.
Figure 6:
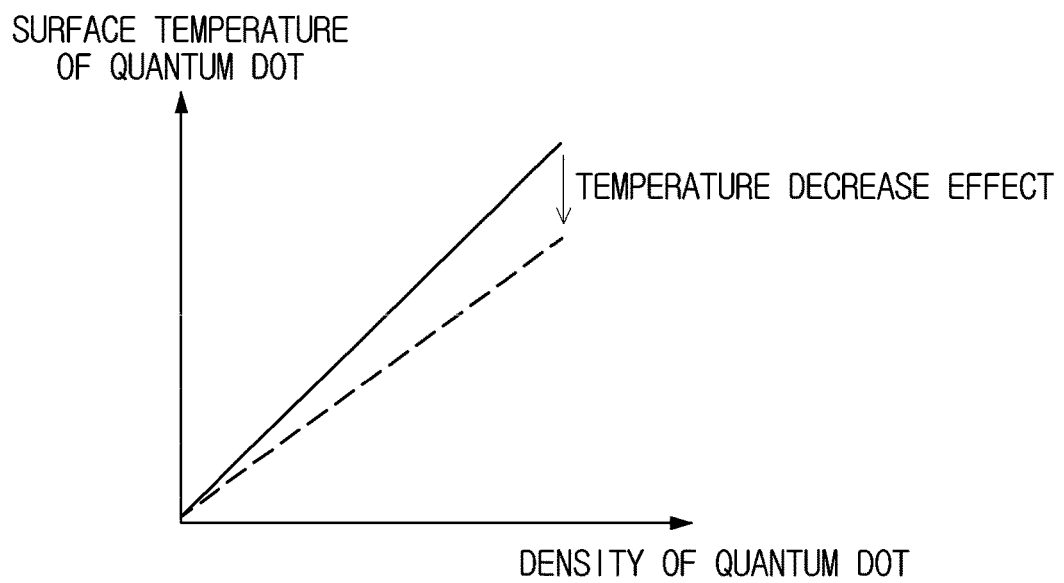
FIG. 6 is a graph illustrating the relationship between density of a quantum dot and surface temperature of the quantum dot in a quantum dot unit or a quantum dot sheet applicable to a display apparatus according to an exemplary embodiment.

FIG. 5 is a graph illustrating the relationship between surface temperature of a quantum dot 102 and efficiency of the quantum dot 102 in a quantum dot unit 100 or a quantum dot sheet applicable to a display apparatus according to an exemplary embodiment. FIG. 6 is a graph illustrating the relationship between density of a quantum dot 102 and surface temperature of the quantum dot 102 in a quantum dot unit 100 or a quantum dot sheet applicable to the display apparatus according to an exemplary embodiment.

The quantum dot 102 receives light from the light source 11, changes the wavelength of the light, and emits the light with the changed wavelength while simultaneously generating heat. As illustrated in FIG. 5, the surface temperature of the quantum dot 102 is inversely proportional to the efficiency of the quantum dot unit 100. That is, as the surface temperature of the quantum dot 102 decreases, light conversion efficiency of the quantum dot unit 100 increases. Conversely, as the surface temperature of the quantum dot 102 increases, light conversion efficiency of the quantum dot unit 100 decreases.

As can be seen in the graph of FIG. 6, the density of the quantum dot 102 is directly proportional to the surface temperature of the quantum dot 102. That is, as the number of the quantum dots 102 contained in the same hollow 101a of the glass fiber 101 increases, the surface temperature of the quantum dots 102 increases. Conversely, as the number of the quantum dots 102 contained in the same hollow 101a of the quantum dot unit 100 decreases, the surface temperature of the quantum dots 102 decreases.

If the density of the quantum dots 102 contained in the hollow 101a of the glass fiber 101 is too low, a desired amount of light whose wavelength is changed may not be obtained. Thus, a predetermined density or more of the quantum dot 102 may be considered. Therefore, in order to increase the efficiency of the quantum dot unit 100 having the predetermined density or more of the quantum dots 102, heat dissipation performance of the quantum dot unit 100 may serve as an important factor.

The wire 104 inserted into the hollow 101a of the glass fiber 101 of the quantum dot unit 100 may be arranged to dissipate heat generated in the quantum dots 102 out of the quantum dot unit 100. Thus, a diameter of the wire 104 may be increased in proportion to a diameter of the hollow 101a of the glass fiber 101. However, a plurality of wires 104 each having a small diameter may be inserted thereinto to improve light transmittance.

Both ends of the wire 104 may be connected to the bottom chassis 90 of the display apparatus 1 that support the quantum dot unit 100. For example, both ends of the wire 104 may be connected to the heat dissipation member 93 provided in the bottom chassis 90. The ends of the wire 104 may be provided with a connection member 105 for easy connection to the bottom chassis 90 or the heat dissipation member 93. The connection member 105 may include a metal having high thermal conductivity or the like.

Figure 7:
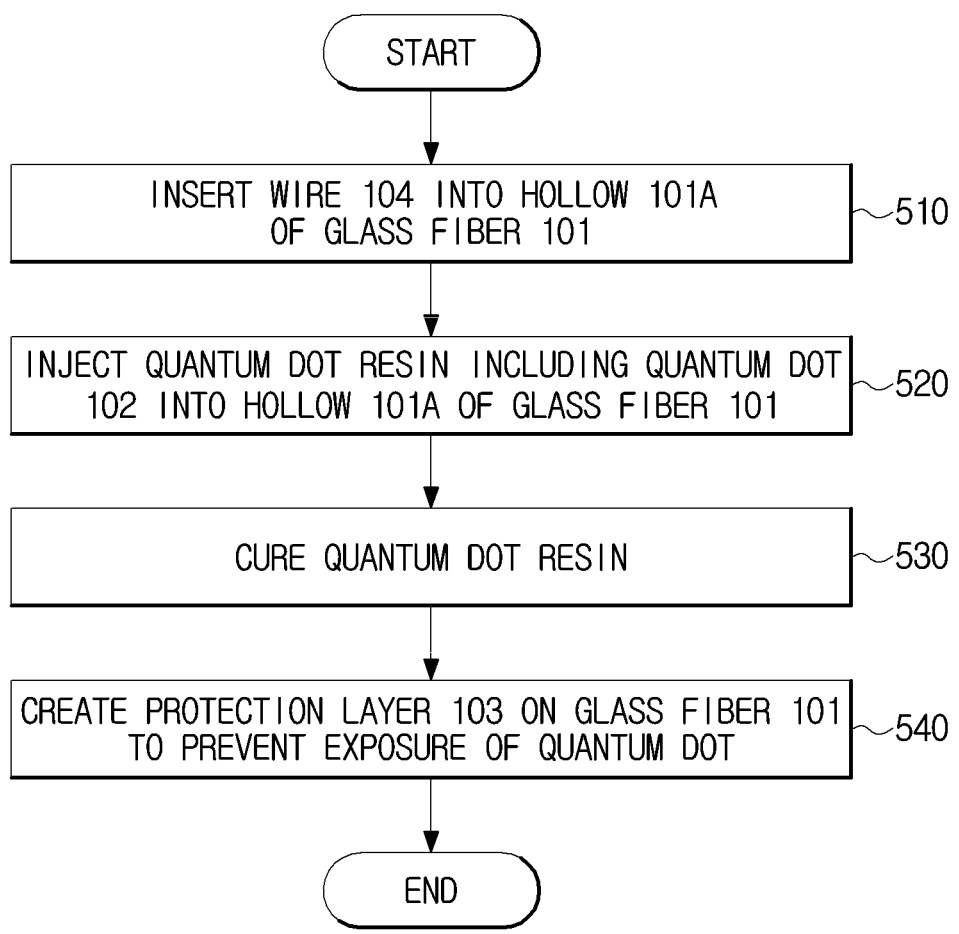
FIG. 7 is a flowchart for describing a method of manufacturing a quantum dot unit according to an exemplary embodiment.

As illustrated in FIG. 6, an effect of reducing the surface temperature of the quantum dot 102 may be obtained in the quantum dot unit 100 having the same density of quantum dots since the quantum dot unit 100 inlcudes the wire 104 with a heat dissipating capability and/or structure. That is, even when the density of quantum dots increases in the hollow 101a of the quantum dot unit 100, a surface temperature increase ratio of the quantum dots may be reduced by the heat dissipation effect of the wire 104. Thus, the density of quantum dots may be determined with less influence by or consideration of the temperature, so that the quantum dot unit 100 may be easily designed, FIG. 7 is a flowchart for describing a method of manufacturing a quantum dot unit 100 according to an exemplary embodiment.

According to the present exemplary embodiment, a glass fiber 101 having a hollow 101a and a quantum dot resin including quantum dots 102 is prepared or obtained.

The glass fiber 101 is cut to a length corresponding to or based on a length of the light source module 10 or one side of the light guide plate 50 of the display apparatus 1 to which the quantum dot unit 100 is installed.

A wire 104 having a length greater than that of the cut glass fiber 101 is prepared or obtained and inserted into the hollow 101a of the glass fiber 101 (510). The wire 104 is prepared to have a sufficient length to allow the manufactured quantum dot unit 100 to be connected to the bottom chassis 90 or the heat dissipation member 93 and is arranged to protrude from the both ends of the glass fiber 101.

The resin including the quantum dots 102 is injected into the hollow 101a of the glass fiber 101 into which the wire 104 is inserted (520) and the injected quantum dot resin is cured (530).

A protection layer 103 is formed or provided to cover both ends of the glass fiber 101 or the entire glass fiber 101 to prevent the quantum dots 102 contained in the quantum dot resin from being exposed to air (540).

For easy connection between the prepared wire 104 of the quantum dot unit 100 and the bottom chassis 90 or the heat dissipation member 93 of the display apparatus 1, both ends of the wire 104 may be connected to the connection member 105 to be connected to the bottom chassis 90 or the heat dissipation member 93 of the display apparatus 1.

Figure 8:
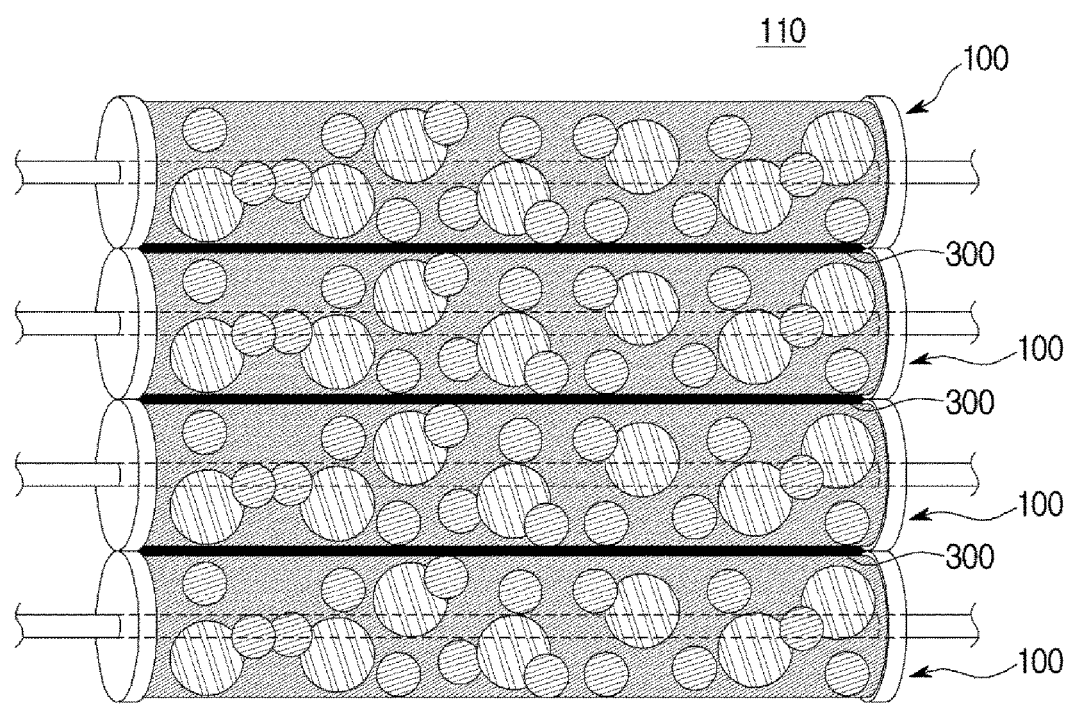
FIG. 8 is a view illustrating a quantum dot unit according to a second exemplary embodiment applicable to a display apparatus according to an exemplary embodiment.

FIG. 8 is a view illustrating a quantum dot unit 110 according to a second exemplary embodiment applicable to a display apparatus according to an exemplary embodiment.

As illustrated in FIG. 8, the quantum dot unit 110 may include a plurality of stacked quantum dot units 100. In other words, the quantum dot unit 110 according to the second exemplary embodiment may include a plurality of quantum dot units 100 according to an exemplary embodiment (e.g., the first exemplary embodiment described above).

The quantum dot unit 110 according to the second exemplary embodiment may further include an adhesive member 300 or adhesive. The adhesive member 300 may attach the plurality of quantum dot units 100 according to an exemplary embodiment to each other. The adhesive member 300 may include at least one of an acrylic resin, a silicone resin, an epoxy resin, etc.

As illustrated in FIG. 8, the adhesive member 300 may be disposed between adjacent quantum dot units 100 according to an exemplary embodiment. Particularly, the adhesive member 300 may be disposed on contact surfaces of adjacent quantum dot units 100 according to an exemplary embodiment. For example, when a first quantum dot unit and a second quantum dot unit are stacked, the adhesive member 300 may be disposed between contact surfaces of the first quantum dot unit and the second quantum dot unit.

Figure 9:
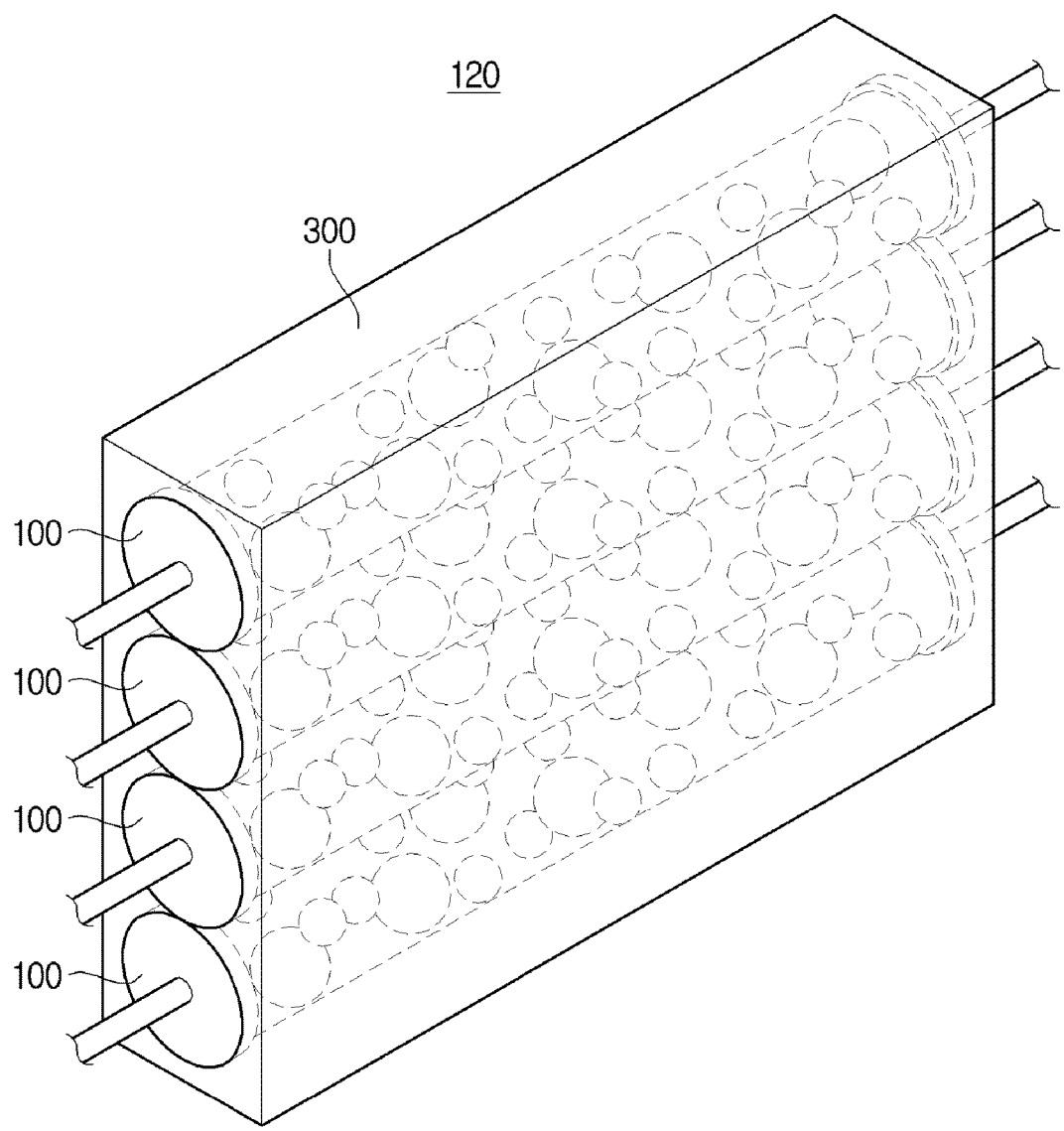
FIG. 9 is a view illustrating a quantum dot unit according to a third exemplary embodiment applicable to a display apparatus according to an exemplary embodiment.

FIG. 9 is a view illustrating a quantum dot unit 120 according to a third exemplary embodiment applicable to a display apparatus according to an exemplary embodiment.

As illustrated in FIG. 9, the quantum dot unit 120 according to the third exemplary embodiment may include a plurality of stacked quantum dot units 100 according to an exemplary embodiment (e.g., the first exemplary embodiment described above).

The quantum dot unit 120 according to the third exemplary embodiment may further include an adhesive member 300. The adhesive member 300 may attach the plurality of quantum dot units 100 according to an exemplary embodiment to each other. The adhesive member 300 may include at least one of an acrylic resin, a silicone resin, an epoxy resin, etc.

As illustrated in FIG. 9, the adhesive member 300 may cover the plurality of stacked quantum dot units 100 according to an exemplary embodiment. In other words, the adhesive member 300 may cover or surround all outer circumferential surfaces of the plurality of stacked quantum dot units 100 according to the first exemplary embodiment.

Figure 10:
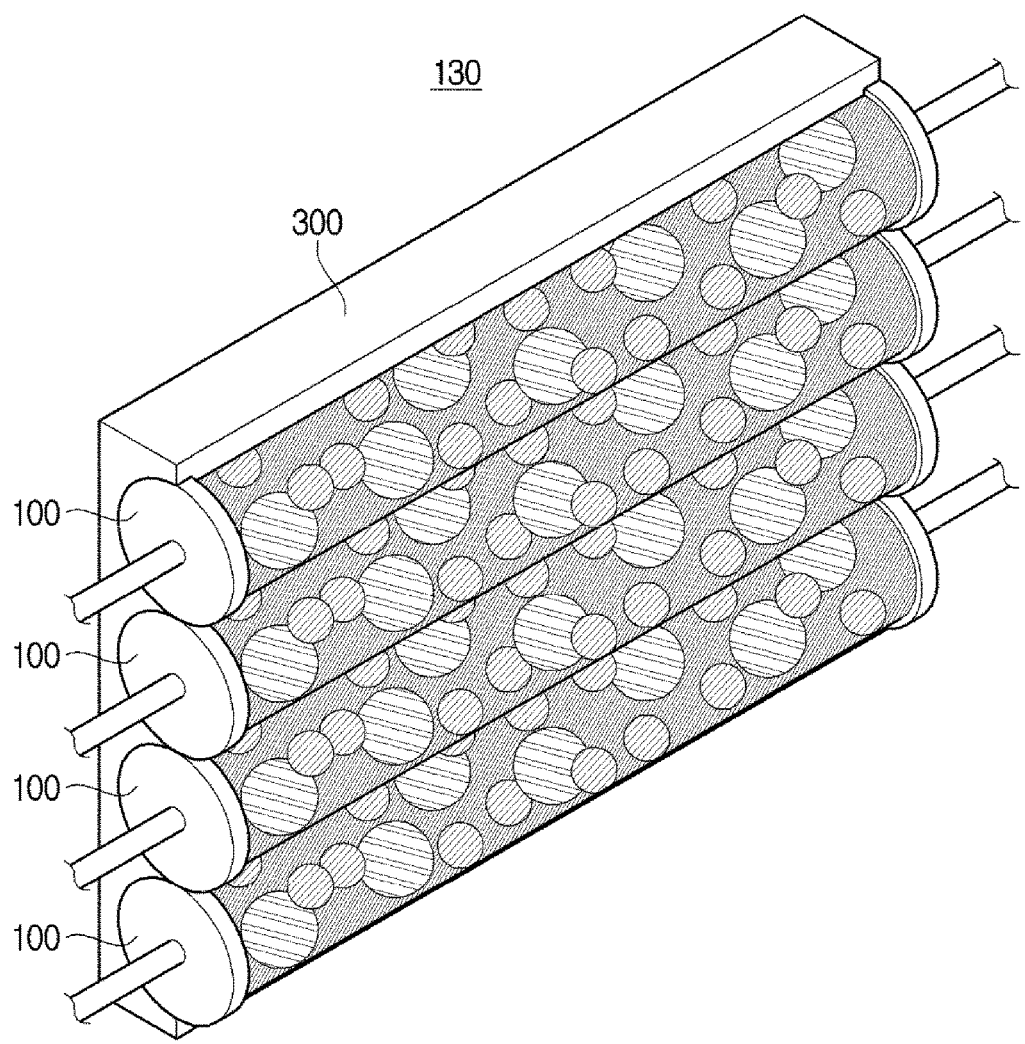
FIG. 10 is a view illustrating a quantum dot unit according to a fourth exemplary embodiment applicable to a display apparatus according to an exemplary embodiment.

FIG. 10 is a view illustrating a quantum dot unit 130 according to a fourth exemplary embodiment applicable to a display apparatus according to an exemplary embodiment.

As illustrated in FIG. 10, the quantum dot unit 130 according to the fourth exemplary embodiment may include a plurality of stacked quantum dot units 100 according to an exemplary embodiment (e.g., the first exemplary embodiment).

The quantum dot unit 130 according to the fourth exemplary embodiment may further include an adhesive member 300. The adhesive member 300 may attach the plurality of quantum dot units 100 according to an exemplary embodiment to each other. The adhesive member 300 may include at least one of an acrylic resin, a silicone resin, an epoxy resin, etc.

As illustrated in FIG. 10, the adhesive member 300 may cover a part of each of the plurality of stacked quantum dot units 100 according to an exemplary embodiment. In other words, the adhesive member 300 may cover a part of the outer circumferential surface of each of the plurality of stacked quantum dot units 100 according to an exemplary embodiment.

Figure 11:
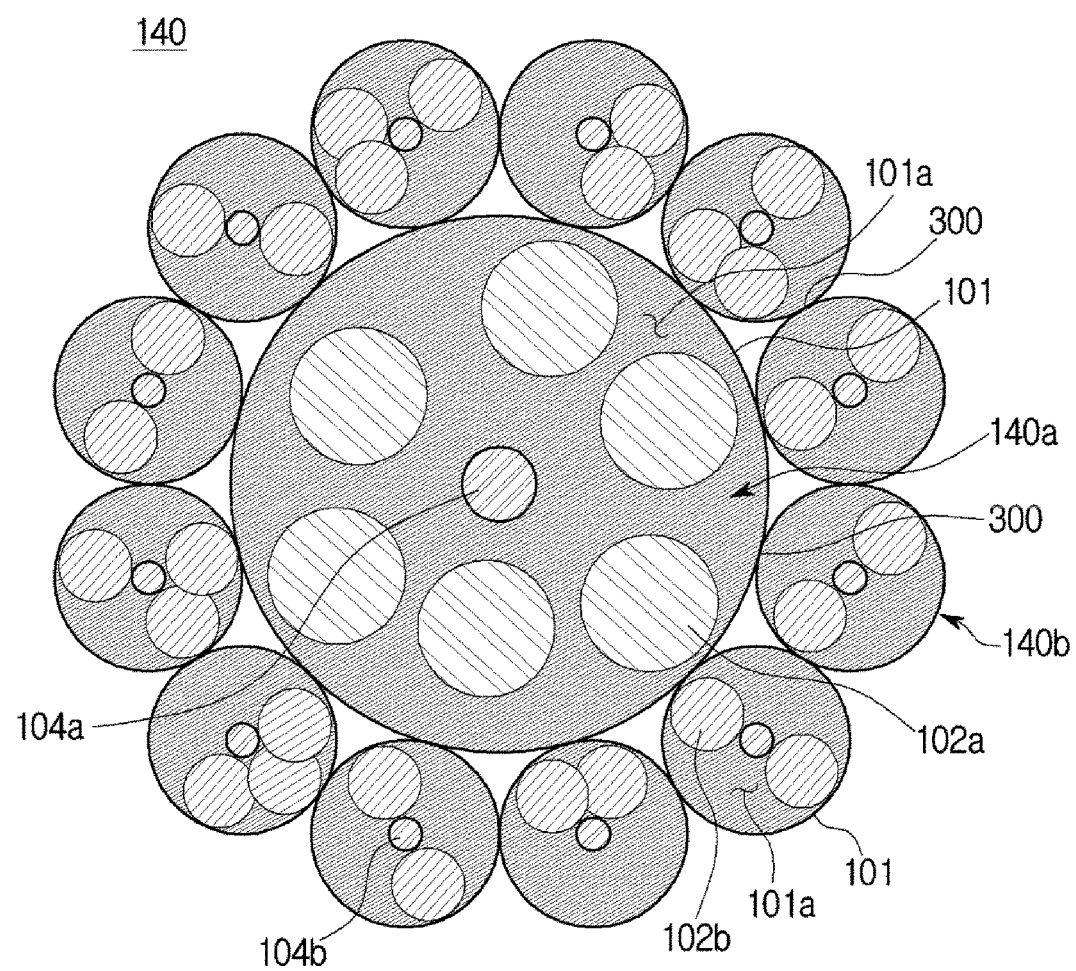
FIG. 11 is a view illustrating a quantum dot unit according to a fifth exemplary embodiment applicable to a display apparatus according to an exemplary embodiment.

FIG. 11 is a view illustrating a quantum dot unit 140 according to a fifth exemplary embodiment applicable to a display apparatus according to an exemplary embodiment.

As illustrated in FIG. 11, the quantum dot unit 140 according to the fifth exemplary embodiment may include a first quantum dot unit 140a. The first quantum dot unit 140a may have softness. The first quantum dot unit 140a may include a glass fiber 101 having a hollow 101a and a first quantum dot 102a accommodated in the hollow 101a. In addition, the first quantum dot unit 140a may further include a protection layer provided to cover both ends of the glass fiber 101.

The first quantum dot unit 140a may further include a first wire 104a inserted into the hollow 101a of the glass fiber 101. The first wire 104a may have a length greater than that of the glass fiber 101 and protrude from the both ends of the glass fiber 101. The first wire 104a may include a metal having high thermal conductivity such as copper, gold, and silver. A thinner first wire 104a may have higher light transmittance. Furthermore, the first quantum dot unit 140a may include a plurality of first wires 104a penetrating the hollow 101a of the glass fiber 101.

Both ends of the first wire 104a may be connected to the bottom chassis 90 of the display apparatus 1 that supports the quantum dot unit 140a. For example, both ends of the first wire 104a may be connected to the heat dissipation member 93 of the bottom chassis 90.

The quantum dot unit 140 according to the fifth exemplary embodiment may further include a plurality of second quantum dot units 140b. The plurality of second quantum dot units 140b may be arranged along the outer circumferential surface of the first quantum dot unit 140a. Each of the plurality of second quantum dot units 140b may have softness. Each of the plurality of second quantum dot units 140b may include a glass fiber 101 having a hollow 101a and a second quantum dot 102b accommodated in the hollow 101a. The second quantum dot 102b may generate a color different from that generated by the first quantum dot 102a. In addition, each of the plurality of second quantum dot units 140b may further include a protection layer provided to cover both ends of the glass fiber 101.

The second quantum dot unit 140b may further include a second wire 104b inserted into the hollow 101a of the glass fiber 101. The second wire 104b may have a length greater than that of the glass fiber 101 and may be arranged to protrude from both ends of the glass fiber 101. The second wire 104b may include a metal having high thermal conductivity such as copper, gold, and silver. A thinner second wire 104b may have higher light transmittance. Furthermore, the second quantum dot unit 140b may include a plurality of second wires 104b penetrating the hollow 101a of the glass fiber 101.

Both ends of the second wire 104b may be connected to the bottom chassis 90 of the display apparatus 1 that supports the quantum dot unit 140a. For example, both ends of the second wire 104b may be connected to the heat dissipation member 93 provided in the bottom chassis 90.

A diameter of the first quantum dot unit 140a may be greater than a diameter of each of the plurality of second quantum dot units 140b. In addition, a diameter of the first wire 104a may be greater than a diameter of the second wire 104b.

The second quantum dot units 140b may all have the same diameter and the second wires 104b may also all have the same diameter.

However, it is understood that one or more other exemplary embodiments are not limited thereto. For example, according to another exemplary embodiment, at least one of the plurality of second quantum dot units 140b may have a different diameter from another and at least one of the second wires 104b of the second quantum dot units 140a may also have a different diameter from another.

According to an exemplary embodiment, the first quantum dot 102a may generate red light and the second quantum dot 102b may generate green light. Furthermore, the number of the second quantum dots 102b may be that of the first quantum dots 102a.

The quantum dot unit 140 according to the fifth exemplary embodiment may further include an adhesive member 300. The adhesive member 300 may attach the first quantum dot unit 140a and the plurality of second quantum dot units 140b to each other. In addition, the adhesive member 300 may attach the plurality of second quantum dot units 140b to each other. The adhesive member 300 may include at least one of an acrylic resin, a silicone resin, an epoxy resin, etc.

Figure 12:
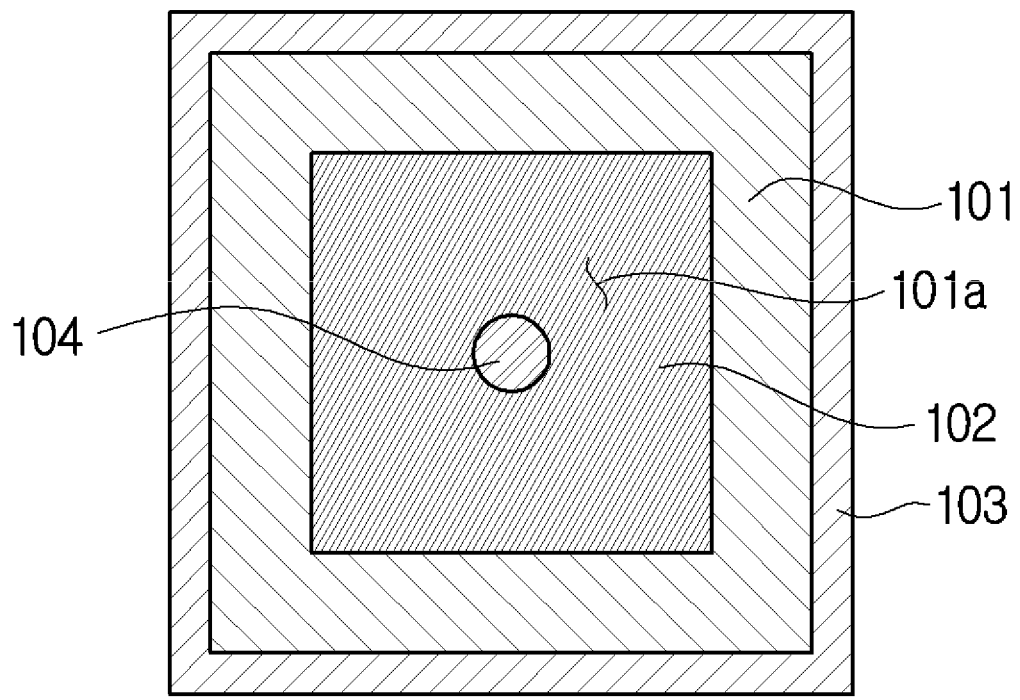
FIG. 12 is a view illustrating a quantum dot unit according to a sixth exemplary embodiment applicable to a display apparatus according to an exemplary embodiment.

FIG. 12 is a view illustrating a quantum dot unit 150 according to a sixth exemplary embodiment applicable to a display apparatus according to an exemplary embodiment. Hereinafter, redundant descriptions already given above with reference to FIG. 4 will not be repeated.

As illustrated in FIG. 12, the glass fiber 101 of the quantum dot unit 150 according to the sixth exemplary embodiment may have a rectangular cross-section. However, it is understood that the shape of the cross-section of the glass fiber 101 is not limited thereto.

Figure 13:
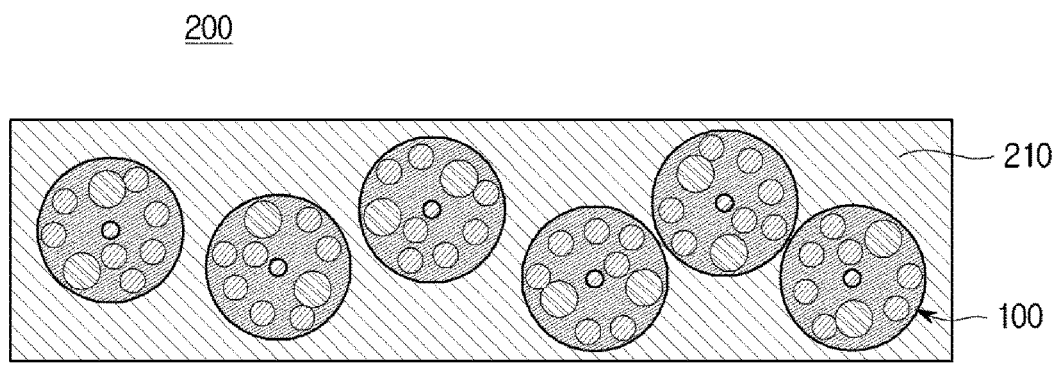
FIG. 13 is a view illustrating a quantum dot sheet according to a first exemplary embodiment applicable to a display apparatus according to an exemplary embodiment.

FIG. 13 is a view illustrating a quantum dot sheet 200 according to a first exemplary embodiment applicable to a display apparatus 1 according to an exemplary embodiment.

As illustrated in FIG. 13, the display apparatus 1 may further include a quantum dot sheet 200. In other words, the display apparatus 1 may further include the quantum dot sheet 200 in the form of a sheet including a plurality of quantum dot units 100 according to an exemplary embodiment (e.g., the first exemplary embodiment and/or the fifth exemplary embodiment).

The quantum dot sheet 200 may be implemented by dispersing the plurality of quantum dot units 100 according to an exemplary embodiment (e.g., the first exemplary embodiment) in a resin 210. The quantum dot sheet 200 may be implemented by an extrusion process.

Figure 14:
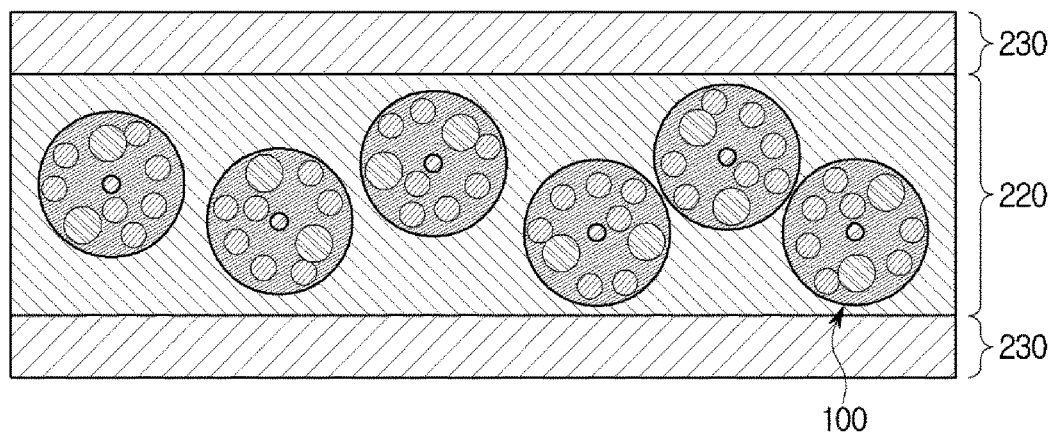
FIG. 14 is a view illustrating a quantum dot sheet according to a second exemplary embodiment applicable to a display apparatus according to an exemplary embodiment.

FIG. 14 is a view illustrating a quantum dot sheet 200a according to a second exemplary embodiment applicable to a display apparatus 1 according to an exemplary embodiment.

As illustrated in FIG. 14, the display apparatus 1 may further include a quantum dot sheet 200a. In other words, the display apparatus 1 may further include a quantum dot sheet 200a in the form of a sheet including a plurality of quantum dot units 100 according to an exemplary embodiment (e.g., the first exemplary embodiment and/or the fifth exemplary embodiment).

The quantum dot sheet 200a according to the second exemplary embodiment may have a quantum dot containing layer 220 including a plurality of quantum dot units, e.g., at least one of a plurality of quantum dot units 100 according to the first exemplary embodiment and a plurality of quantum dot units 140 according to the fifth exemplary embodiment.

The quantum dot containing layer 220 may be implemented in the same or similar manner as in the quantum dot sheet 200 according to the first exemplary embodiment as described above with reference to FIG. 13.

The quantum dot sheet 200a according to the second exemplary embodiment may further include a protection layer 230 stacked on at least one surface of the quantum dot containing layer 220. The protection layer 230 may be coated on at least one surface of the quantum dot containing layer 220. For example, the protection layer 230 may be coated on top and bottom surfaces of the quantum dot containing layer 220. The protection layer 230 may include polyethylene terephthalate (PET).

Figure 15:
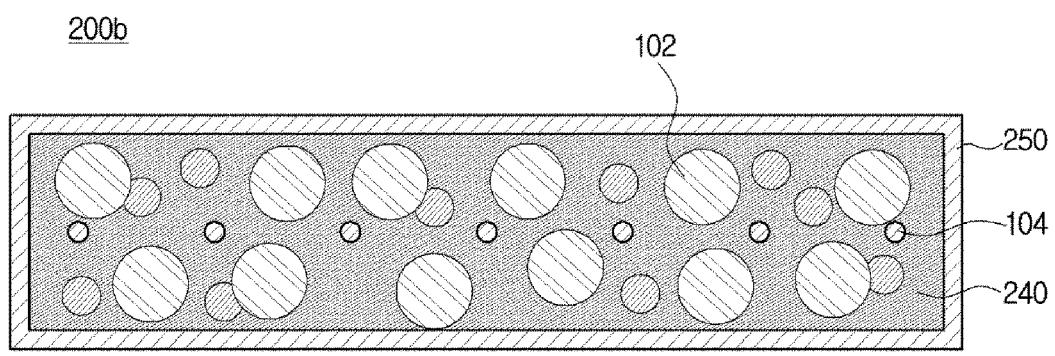
FIG. 15 is a view illustrating a quantum dot sheet according to a third exemplary embodiment applicable to a display apparatus according to an exemplary embodiment.

FIG. 15 is a view illustrating a quantum dot sheet 200b according to a third exemplary embodiment applicable to a display apparatus 1 according to an exemplary embodiment.

As illustrated in FIG. 15, the display apparatus 1 may further include a quantum dot sheet 200b. Particularly, the display apparatus 1 may include the quantum dot sheet 200b in the form of a sheet including the quantum dots 102. The quantum dot sheet 200b may include a quantum dot containing layer 240 implemented by dispersing the quantum dots 102 in a resin and extruding the resultant.

The quantum dot sheet 200b according to the third exemplary embodiment may further include a protection layer 250 that covers at least one portion of the quantum dot containing layer 240. For example, the protection layer 250 may be coated to cover the entire quantum dot containing layer 240. The protection layer 250 may include polyethylene terephthalate (PET).

In addition, the quantum dot sheet 200b according to the third exemplary embodiment may include at least one wire 104 penetrating the quantum dot containing layer 240. The wire 104 may have a length greater than that of a side of the quantum dot containing layer 240 and may be arranged to protrude from both ends of the quantum dot sheet 200b. The wire 104 may include a metal having high thermal conductivity, such as copper, gold, and silver. A thinner wire 104 may have higher light transmittance. When the plurality of wires 104 are inserted into the quantum dot sheet 200b, the plurality of wires 104 may be arranged in parallel with one another or in a mesh form.

Both ends of the wire 104 may be connected to the bottom chassis 90 of the display apparatus 1 that supports the quantum dot sheet 200b. For example, the both ends of the wire 104 may be connected to the heat dissipation member 93 of the bottom chassis 90.

FIG. 3 is a view illustrating a structure in which a quantum dot unit 100 according to an exemplary embodiment (e.g., the first exemplary embodiment of FIG. 4) is disposed in a display apparatus 1 according to an exemplary embodiment.

As illustrated in FIG. 3, the quantum dot unit 100 according to the first exemplary embodiment may be disposed between the light source 11 and the light guide plate 50 to convert wavelengths of light emitted from the light source 11.

The light guide plate 50 may have a light-incident surface 51 on which light emitted from the light source 11 is incident. The light guide plate 50 may further have a light-emitting surface 52 through which light incident on the light guide plate 50 is emitted toward the display panel 4. In addition, the light guide plate 50 may further include a bottom surface 53 facing the light-emitting surface 52 of the light guide plate 50.

The quantum dot unit 100 according to the first exemplary embodiment may be disposed between the light source 11 and the light-incident surface 51 of the light guide plate 50 to convert wavelengths of light emitted from the light source 11.

The quantum dot unit 100 according to the first exemplary embodiment may be arranged to be spaced apart respectively from the light guide plate 50 and the light source 11.

The light source 11 may emit blue light. The blue light emitted from the light source 11 is converted into white light while passing through the quantum dot unit 100. White light having passed through the quantum dot unit 100 is incident on the light-incident surface 51 of the light guide plate 50 and emitted through the light-emitting surface 52 of the light guide plate 50 toward the display panel 4.

Figure 16:
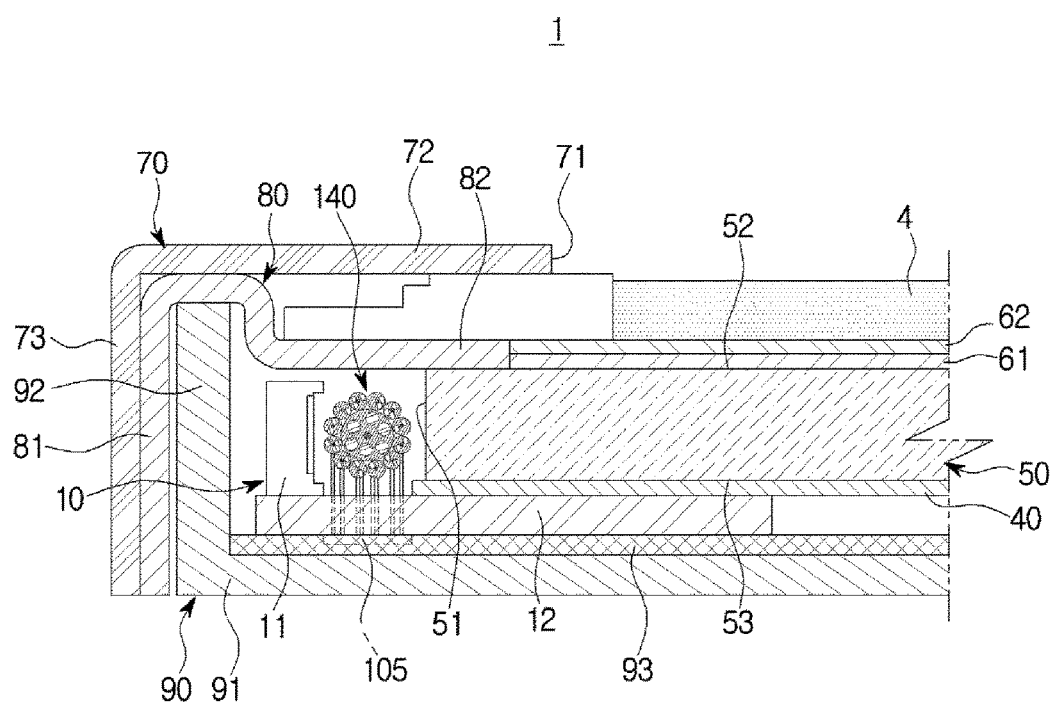
FIG. 16 is a view illustrating a structure in which the quantum dot unit according to the fifth exemplary embodiment of FIG. 11 is disposed in a display apparatus according to an exemplary embodiment.

FIG. 16 is a view illustrating a structure in which a quantum dot unit 140 according to an exemplary embodiment (e.g., the fifth exemplary embodiment of FIG. 11) is disposed in a display apparatus 1 according to an exemplary embodiment.

As illustrated in FIG. 16, the quantum dot unit 140 according to the fifth exemplary embodiment may be disposed between the light source 11 and the light guide plate 50 to convert wavelengths of light emitted from the light source 11.

The light guide plate 50 may have a light-incident surface 51 on which light emitted from the light source 11 is incident. The light guide plate 50 may further have a light-emitting surface 52 through which light incident on the light guide plate 50 is emitted toward the display panel 4.

The quantum dot unit 140 according to the fifth exemplary embodiment may be disposed between the light source 11 and the light-incident surface 51 of the light guide plate 50 to convert wavelengths of light emitted from the light source 11.

The quantum dot unit 140 according to the fifth exemplary embodiment may be disposed to be spaced apart respectively from the light guide plate 50 and the light source 11.

The light source 11 may emit blue light. The blue light emitted from the light source 11 is converted into white light while passing through the quantum dot unit 140. White light having passed through the quantum dot unit 140 is incident on the light-incident surface 51 of the light guide plate 50 and emitted through the light-emitting surface 52 of the light guide plate 50 toward the display panel 4.

Since the quantum dot unit 140 according to the fifth exemplary embodiment includes a plurality of wires 104, both ends of each of the plurality of wires 104 may be connected to the connection member 105 and the connection member 105 may be connected to the bottom chassis 90 or the heat dissipation member 93 for easy connection between the plurality of wires 104 and the bottom chassis 90 or the heat dissipation member 93.

Figure 17:
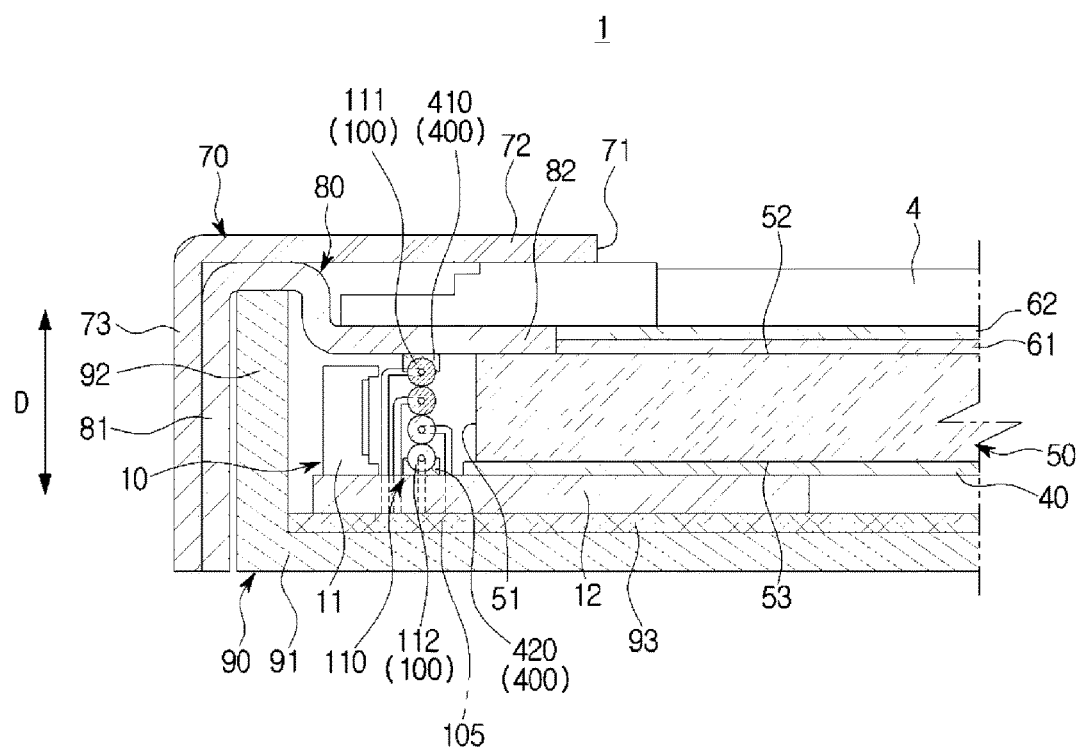
FIG. 17 is a view illustrating a structure in which the quantum dot unit according to the second exemplary embodiment of FIG. 8 is disposed in a display apparatus according to an exemplary embodiment.

FIG. 17 is a view illustrating a structure in which a quantum dot unit 110 (e.g., according to the second exemplary embodiment of FIG. 8) is disposed in a display apparatus 1 according to an exemplary embodiment.

As illustrated in FIG. 17, the quantum dot unit 110 according to the second exemplary embodiment may be disposed between the light source 11 and the light guide plate 50 to convert wavelengths of light emitted from the light source 11. In this case, the quantum dot unit 110 according to the second exemplary embodiment may have a structure in which a plurality of quantum dot units 100 according to an exemplary embodiment (e.g., the first exemplary embodiment) are stacked in a thickness direction D of the light guide plate 50.

The light guide plate 50 may have a light-incident surface 51 on which light emitted from the light source 11 is incident. The light guide plate 50 may further have a light-emitting surface 52 through which light incident on the light guide plate 50 is emitted toward the display panel 4.

The quantum dot unit 110 according to the second exemplary embodiment may be disposed between the light source 11 and the light-incident surface 51 of the light guide plate 50 to convert wavelengths of light emitted from the light source 11.

The quantum dot unit 110 according to the second exemplary embodiment may be disposed to be spaced apart respectively from the light guide plate 50 and the light source 11.

The light source 11 may emit blue light. The blue light emitted from the light source 11 is converted into white light while passing through the quantum dot unit 110. White light having passed through the quantum dot unit 110 is incident on the light-incident surface 51 of the light guide plate 50 and emitted through the light-emitting surface 52 of the light guide plate 50 toward the display panel 4.

The display apparatus 1 may include the printed circuit board 12 mounted with the light source 11 and disposed under the light guide plate 50 in the thickness direction D of the light guide plate 50.

The display apparatus 1 may further include the middle mold 80 configured to support the display panel 4. The middle mold 80 may include the intermediate support part 82 disposed on the light guide plate 50 in the thickness direction D of the light guide plate 50 to face the printed circuit board 12 with the light source 11 therebetween.

The display apparatus 1 may further include a fixing member 400. The fixing member 400 may include a first fixing member 410 installed or provided at the intermediate support part 82 to fix a first quantum dot unit 111 facing the intermediate support part 82 among the plurality of quantum dot units 100. The fixing member 400 may further include a second fixing member 420 installed or provided at the printed circuit board 12 to fix a second quantum dot unit 112 facing the printed circuit board 12 among the plurality of quantum dot units 100.

Since the quantum dot unit 110 according to the second exemplary embodiment includes a plurality of wires 104, both ends of each of the plurality of wires 104 may be connected to the connection member 105 and the connection member 105 may be connected to the bottom chassis 90 or the heat dissipation member 93 for easy connection between the plurality of wires 104 and the bottom chassis 90 or the heat dissipation member 93.

Figure 18:
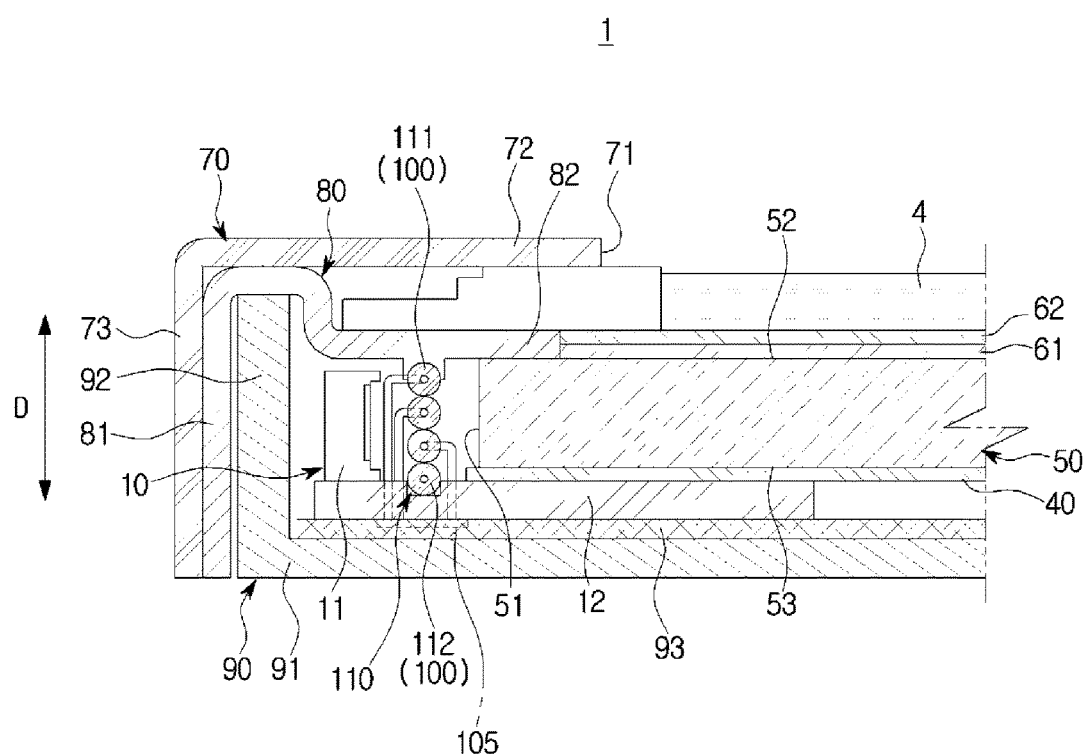
FIG. 18 is a view illustrating another structure in which the quantum dot unit according to the second exemplary embodiment of FIG. 8 is disposed in a display apparatus according to another exemplary embodiment.

FIG. 18 is a view illustrating another structure in which a quantum dot unit 110 according to an exemplary embodiment (e.g., the second exemplary embodiment of FIG. 8) is disposed in a display apparatus 1 according to another exemplary embodiment. Hereinafter, redundant descriptions already given above with reference to FIG. 17 will not be repeated.

As illustrated in FIG. 18, at least one of the plurality of quantum dot units 100 may be fixed to at least one of the printed circuit board 12 and the intermediate support part 82. For example, the first quantum dot unit 111 facing the intermediate support part 82 among the plurality of quantum dot units 100 may be fixed to the intermediate support part 82 and the second quantum dot unit 112 facing the printed circuit board 12 among the plurality of quantum dot units 100 may be fixed to the printed circuit board 12.

When the quantum dot unit 110 according to the second exemplary embodiment is disposed as illustrated in FIG. 18, the separate fixing member 400 described above in FIG. 17 may be omitted.

Figure 19:
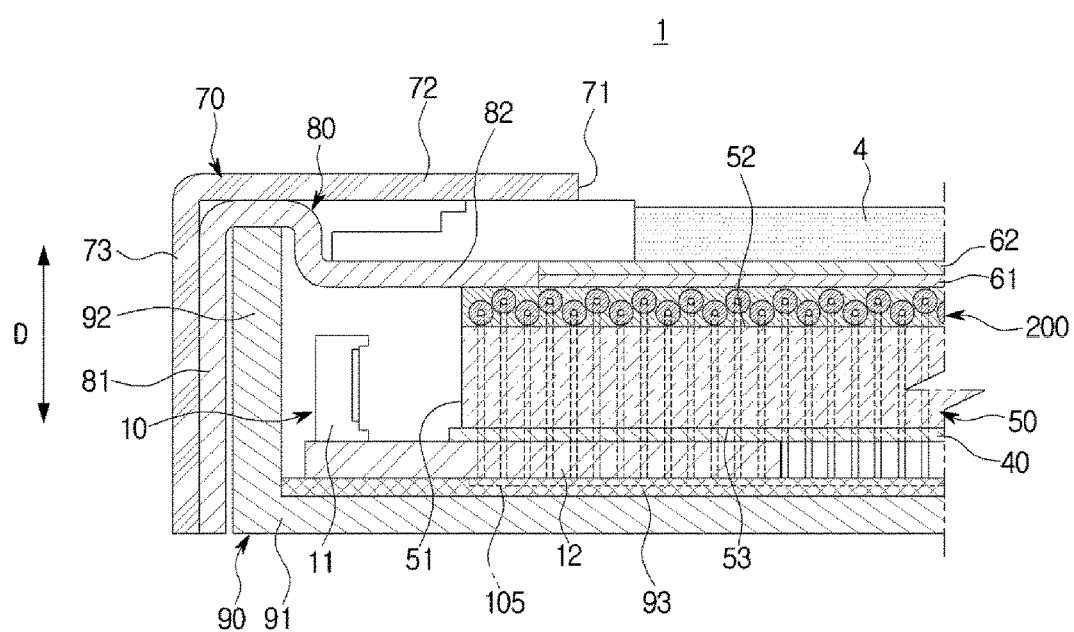
FIG. 19 is a view illustrating a structure in which the quantum dot sheet according to the first exemplary embodiment of FIG. 13 is disposed on a light guide plate in a display apparatus according to an exemplary embodiment.

FIG. 19 is a view illustrating a structure in which a quantum dot sheet 200 according to an exemplary embodiment (e.g., the first exemplary embodiment of FIG. 13) is disposed on a light guide plate 50 in a display apparatus 1 according to an exemplary embodiment.

As illustrated in FIG. 19, the quantum dot sheet 200 according to the first exemplary embodiment may be disposed on the light guide plate 50.

The display apparatus 1 may include the optical sheets 61 and 62 disposed on the light guide plate 50 in the thickness direction D of the light guide plate 50 to improve optical characteristics of light emitted from the light guide plate 50. The quantum dot sheet 200 may be disposed between the light guide plate 50 and the optical sheets 61 and 62.

The light source 11 may emit blue light. The blue light emitted from the light source 11 is incident on the light-incident surface 51 of the light guide plate 50 and emitted through the light-emitting surface 52 of the light guide plate 50 to the quantum dot sheet 200. Blue light is converted into white light while passing through the quantum dot sheet 200. White light having passed through the quantum dot sheet 200 is emitted toward the display panel 4 via the optical sheets 61 and 62.

It is understood that the present exemplary embodiment is not limited to the quantum dot sheet 200 of the first exemplary embodiment illustrated in FIG. 13. For example, according to other exemplary embodiments, the quantum dot sheet 200a according to the second exemplary embodiment of FIG. 14 or the quantum dot sheet 200b according to the third exemplary embodiment of FIG. 15 may also be located at the position of the quantum dot sheet 200 according to the first exemplary embodiment illustrated in FIG. 19.

Since the quantum dot sheets 200, 200a, and 200b according to the first to third exemplary embodiments include the plurality of wires 104, both ends of each of the wires 104 may be connected to the connection member 105 and the connection member 105 may be connected to the bottom chassis 90 or the heat dissipation member 93 for easy connection between the plurality of wires 104 and the bottom chassis 90 or the heat dissipation member 93.

Figure 20:
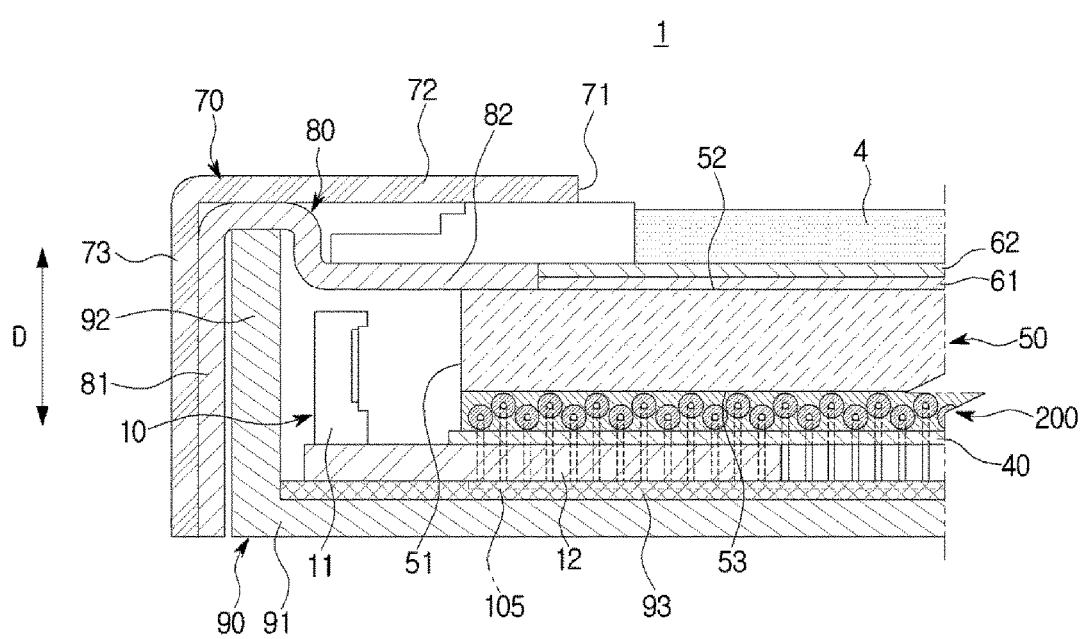
FIG. 20 is a view illustrating a structure in which the quantum dot sheet according to the first exemplary embodiment of FIG. 13 is disposed under a light guide plate in a display apparatus according to an exemplary embodiment.

FIG. 20 is a view illustrating a structure in which a quantum dot sheet 200 (e.g., according to the first exemplary embodiment of FIG. 13) is disposed under a light guide plate 50 in a display apparatus 1 according to an exemplary embodiment.

As illustrated in FIG. 20, the quantum dot sheet 200 according to the first exemplary embodiment may be disposed under the light guide plate 50.

The display apparatus 1 may include the printed circuit board 12 mounted with the light source 11 and disposed under the light guide plate 50 in the thickness direction D of the light guide plate 50. The quantum dot sheet 200 may be disposed between the light guide plate 50 and the printed circuit board 12. Here, the quantum dot sheet 200 according to the first exemplary embodiment may also serve as the reflector sheet 40. In other words, the quantum dot sheet 200 according to the first exemplary embodiment may not only convert blue light into white light but also serve as the reflector sheet 40.

The light source 11 may emit blue light. Blue light emitted from the light source 11 is incident on the light-incident surface 51 of the light guide plate 50. A portion of light incident on the light guide plate 50 may be diffusely reflected by the bottom surface 53 of the light guide plate 50. The diffusely reflected light by the bottom surface 53 of the light guide plate 50 is converted into white light by the quantum dot sheet 200 and then totally reflected by the quantum dot sheet 200, also serving as the reflector sheet 40, toward the bottom surface 53 of the light guide plate 50. The totally reflected light arriving at the bottom surface 53 of the light guide plate 50 is emitted through the light-emitting surface 52 of the light guide plate 50 toward the display panel 4.

It is understood that the present exemplary embodiment is not limited to the quantum dot sheet 200 of the first exemplary embodiment illustrated in FIG. 13. For example, according to other exemplary embodiments, the quantum dot sheet 200a according to the second exemplary embodiment of FIG. 14 or the quantum dot sheet 200b according to the third exemplary embodiment of FIG. 15 may also be located at the position of the quantum dot sheet 200 according to the first exemplary embodiment illustrated in FIG. 20.

Since the quantum dot sheets 200, 200a, and 200b according to the first to third exemplary embodiments include a plurality of wires 104, both ends of each of the wires 104 may be connected to the connection member 105 and the connection member 105 may be connected to the bottom chassis 90 or the heat dissipation member 93 for easy connection between the plurality of wires 104 and the bottom chassis 90 or the heat dissipation member 93.

Figure 21:
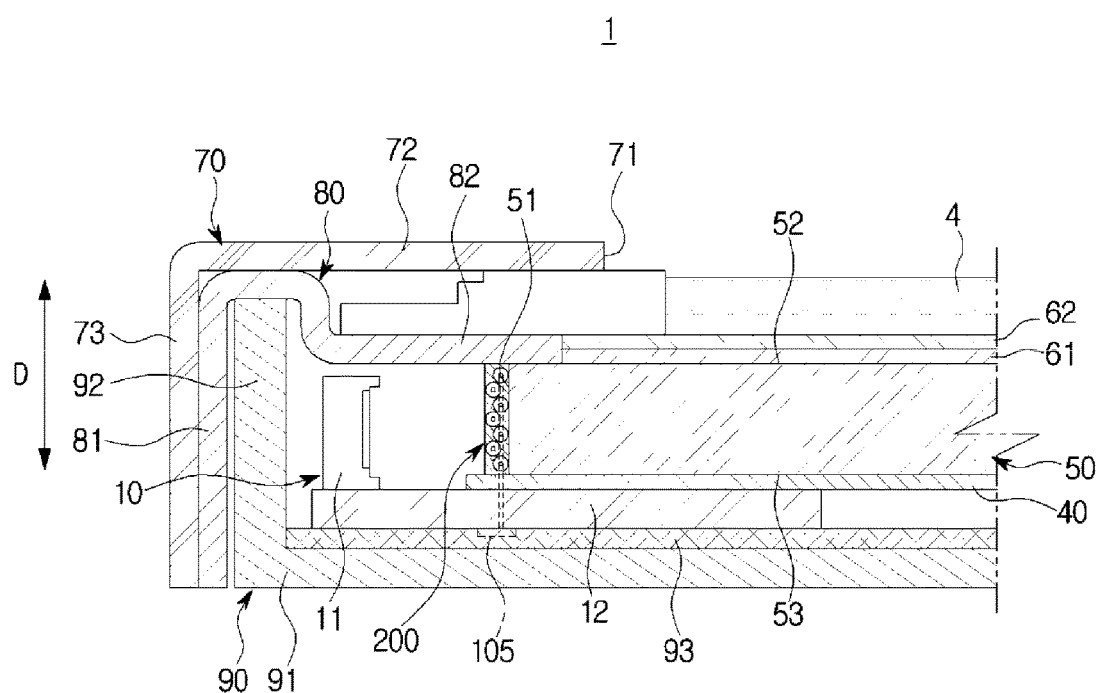
FIG. 21 is a view illustrating a structure in which the quantum dot sheet according to the first exemplary embodiment of FIG. 13 is disposed on one side of a light guide plate in a display apparatus according to an exemplary embodiment.

FIG. 21 is a view illustrating a structure in which a quantum dot sheet 200 (e.g., according to the first exemplary embodiment of FIG. 13) is disposed on a side of a light guide plate 50 in a display apparatus 1 according to an exemplary embodiment.

As illustrated in FIG. 21, the quantum dot sheet 200 according to the first exemplary embodiment may be disposed on one side of the light guide plate 50. That is, the quantum dot sheet 200 according to the first exemplary embodiment may be disposed between the light-incident surface 51 of the light guide plate 50 and the light source 11. In this case, the quantum dot sheet 200 may be attached to the light-incident surface 51 of the light guide plate 50.

The light source 11 may emit blue light. Blue light emitted from the light source 11 is converted into white light while passing through the quantum dot sheet 200. White light having passed through the quantum dot sheet 200 is incident on the light-incident surface 51 of the light guide plate 50 and emitted through the light-emitting surface 52 of the light guide plate 50 toward the display panel 4.

It is understood that the present exemplary embodiment is not limited to the quantum dot sheet 200 of the first exemplary embodiment illustrated in FIG. 13. For example, according to other exemplary embodiments, the quantum dot sheet 200a according to the second exemplary embodiment of FIG. 14 or the quantum dot sheet 200b according to the third exemplary embodiment of FIG. 15 may also be located at the position of the quantum dot sheet 200 according to the first exemplary embodiment illustrated in FIG. 21.

Since the quantum dot sheets 200, 200a, and 200b according to the first to third exemplary embodiments include a plurality of wires 104, both ends of each of the wires 104 may be connected to the connection member 105 and the connection member 105 may be connected to the bottom chassis 90 or the heat dissipation member 93 for easy connection between the plurality of wires 104 and the bottom chassis 90 or the heat dissipation member 93.

Figure 22:
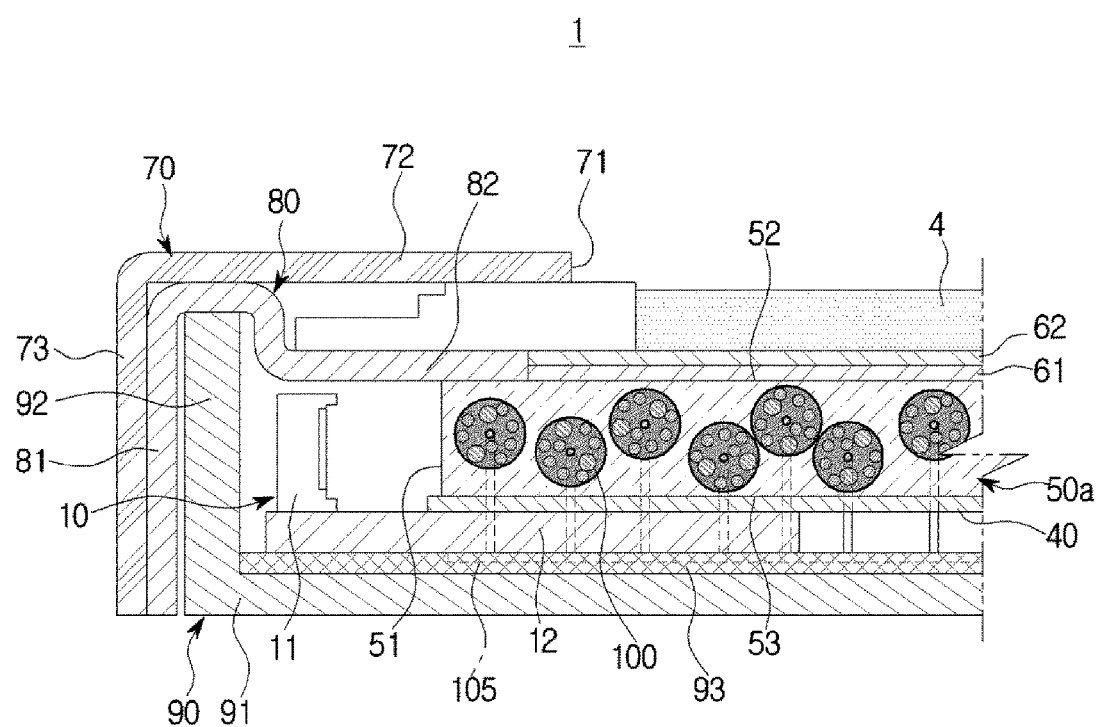
FIG. 22 is a cross-sectional view illustrating a display apparatus according to another exemplary embodiment.

FIG. 22 is a cross-sectional view illustrating a display apparatus 1 according to another exemplary embodiment.

Hereinafter, redundant descriptions already given above with reference to FIGS. 1 to 4 will not be repeated.

As illustrated in FIG. 22, a light guide plate 50a may include a plurality of quantum dot units 100 (e.g., according to the first exemplary embodiment of FIG. 4). In other words, a plurality of quantum dot units 100 according to an exemplary embodiment may be added to the light guide plate 50a during a process of forming the light guide plate 50a. It is understood that the present exemplary embodiment is not limited to the quantum dot unit 100 of the first exemplary embodiment illustrated in FIG. 4. For example, according to other exemplary embodiments, the light guide plate 50a may also include a plurality of quantum dot units 140 according to the fifth exemplary embodiment and/or the plurality of quantum dot units 100 according to the first exemplary embodiment. That is, the light guide plate 50a may include at least one of the plurality of quantum dot units 100 according to the first exemplary embodiment and the plurality of quantum dot units 140 according to the fifth exemplary embodiment.

The light source 11 may emit blue light. Blue light emitted from the light source 11 is incident on the light-incident surface 51 of the light guide plate 50a. Light incident on the light guide plate 50a is converted into white light by at least one of the plurality of quantum dot units 100 according to the first exemplary embodiment and the plurality of quantum dot units 140 according to the fifth exemplary embodiment included in the light guide plate 50a and emitted through the light-emitting surface 52 of the light guide plate 50a toward the display panel 4.

Since the light guide plate 50a includes a plurality of wires 104, both ends of each of the wires 104 may be connected to the connection member 105 and the connection member 105 may be connected to the bottom chassis 90 or the heat dissipation member 93 for easy connection between the plurality of wires 104 and the bottom chassis 90 or the heat dissipation member 93.

Figure 23:
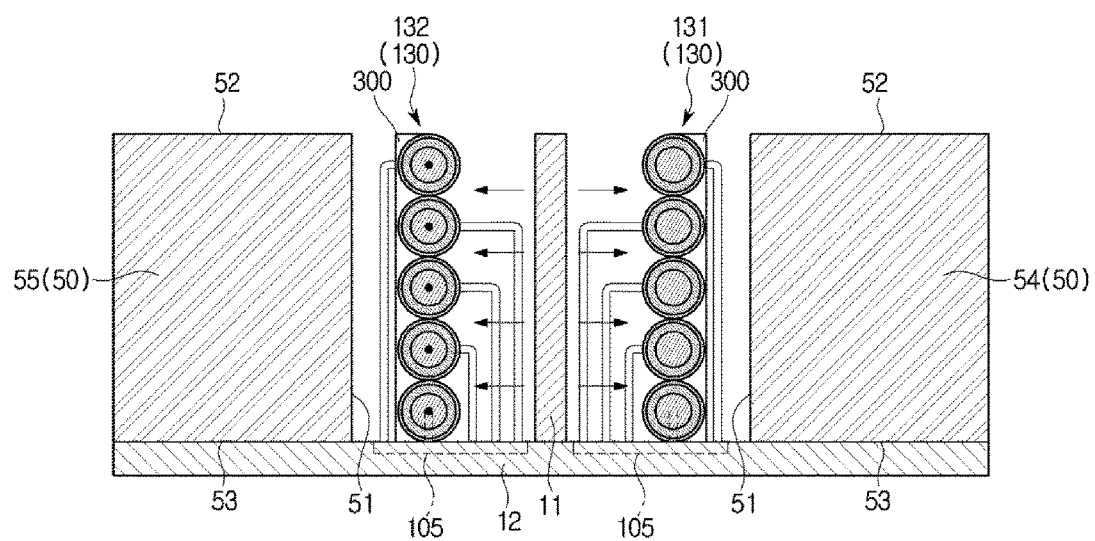
FIG. 23 is a cross-sectional view illustrating a display apparatus according to another exemplary embodiment.

FIG. 23 is a cross-sectional view illustrating a display apparatus 1 according to another exemplary embodiment. Hereinafter, redundant descriptions already given above with reference to FIGS. 1 to 4 and FIG. 10 will not be repeated.

As illustrated in FIG. 23, the display apparatus 1 may include a plurality of light guide plates 50. The plurality of light guide plates 50 may be mounted on the printed circuit board 12 to be spaced apart from each other. For example, the plurality of light guide plates 50 may include a first light guide plate 54 mounted at the right side of the printed circuit board 12 and a second light guide plate 55 mounted at the left side of the printed circuit board 12.

The display apparatus 1 may further include a light source 11 disposed between the plurality of light guide plates 50. The light source 11 may be disposed between the plurality of light guide plates 50 to emit light toward the respective light guide plates 50. The light source 11 may be mounted on the printed circuit board 12 to be disposed between the plurality of light guide plates 50.

The display apparatus 1 may further include a plurality of quantum dot units 130 (e.g., according to the fourth exemplary embodiment of FIG. 10). For example, the plurality of quantum dot units 130 according to the fourth exemplary embodiment may include a first quantum dot unit 131 disposed between the first light guide plate 54 and the light source 11 and a second quantum dot unit 132 disposed between the second light guide plate 55 and the light source 11.

A portion of the first quantum dot unit 131 facing the first light guide plate 54 may be covered with the adhesive member 300. In other words, the first quantum dot unit 131 may be disposed between the first light guide plate 131 and the light source 11 such that the adhesive member 300 faces the first light guide plate 54.

A portion of the second quantum dot unit 132 facing the second light guide plate 55 may be covered with the adhesive member 300. In other words, the second quantum dot unit 132 may be disposed between the second light guide plate 55 and the light source 11 such that the adhesive member 300 faces the second light guide plate 55.

The light source 11 may emit blue light. A portion of blue light emitted from the light source 11 may be converted into white light while passing through the first quantum dot unit 131. White light having passed through the first quantum dot unit 131 is incident on a light-incident surface 51 of the first light guide plate 54 and emitted through a light-emitting surface 52 of the first light guide plate 54 toward the display panel 4. Another portion of blue light emitted from the light source 11 is converted into white light while passing through the second quantum dot unit 132. White light having passed through the second quantum dot unit 132 is incident on a light-incident surface 51 of the second light guide plate 55 and emitted through a light-emitting surface 52 of the second light guide plate 55 toward the display panel 4.

The first quantum dot unit 131 and the second quantum dot unit 132 may be disposed on the printed circuit board 12. Since the first quantum dot unit 131 and the second quantum dot unit 132 include a plurality of wires 104, both ends of each of the plurality of wires 104 may be connected to the connection member 105, and the connection member 105 may be connected to the printed circuit board 12 for easy connection between the plurality of wires 104 and the printed circuit board 12.

Figure 24:
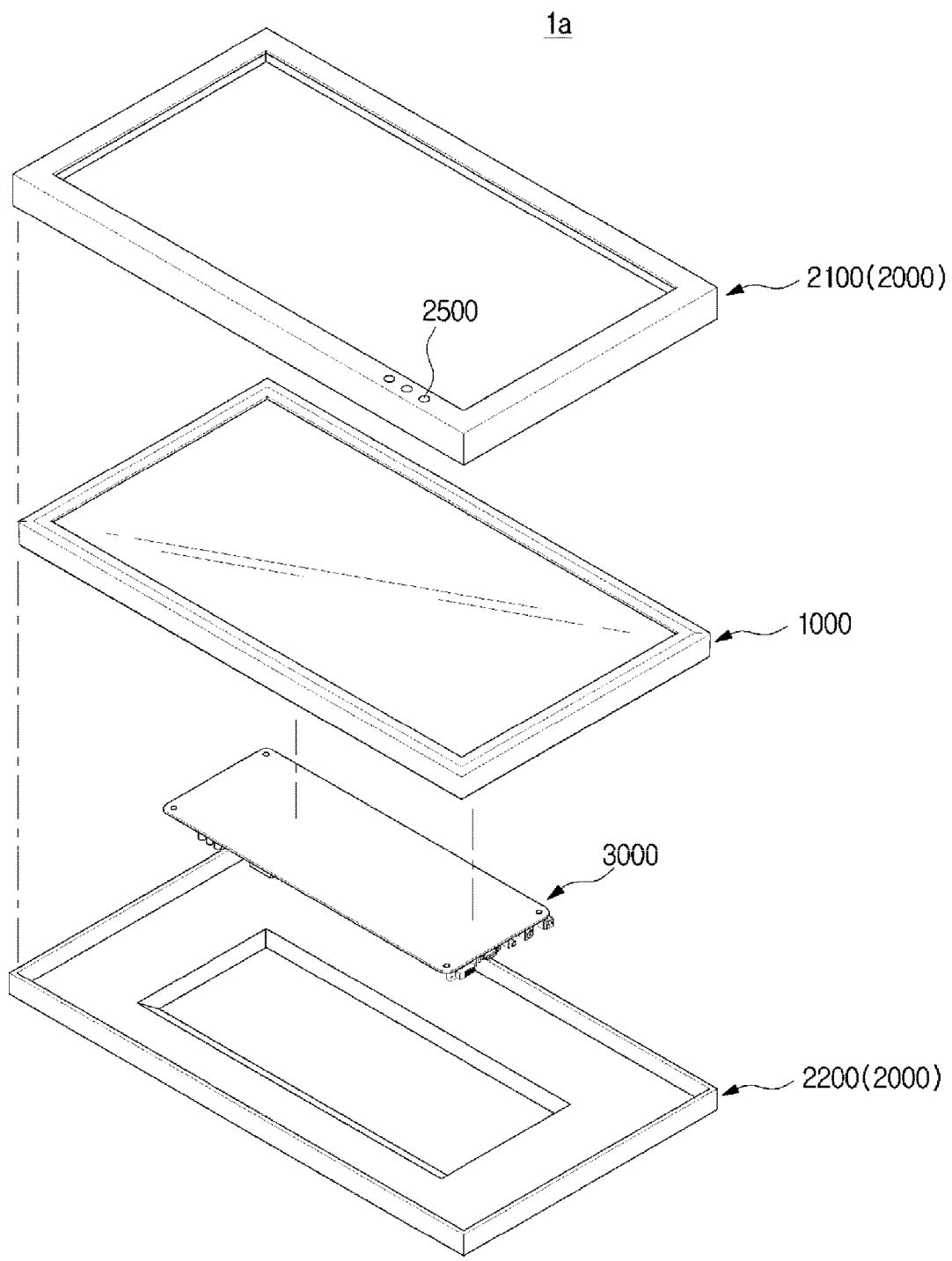
FIG. 24 is an exploded perspective view illustrating a display apparatus according to another exemplary embodiment.

FIG. 24 is an exploded perspective view illustrating a display apparatus 1a according to another exemplary embodiment.

As illustrated in FIG. 24, a display apparatus 1a may include a display module 1000 to display an image. The display module 1000 will be described in more detail below.

The display apparatus 1a may further include a case 2000 defining an appearance thereof.

The case 2000 may include a front case 2100 and a rear case 2200 coupled to each other to accommodate the display module 1000 therein.

The case 2000 may be provided with various terminals providing connection with various external devices. In addition, buttons, switches, or the like to receive an operation command from a user may be provided therein. For example, FIG. 24 illustrates an operation command input button 2500 provided at the front case 2100.

The display apparatus 1a may further include a control board 3000 to supply power and transmit signals to the display module 1000. The control board 3000 may be disposed in the case 2000. In particular, the control board 3000 may be disposed between the display module 1000 and the rear case 2200.

Figure 25:
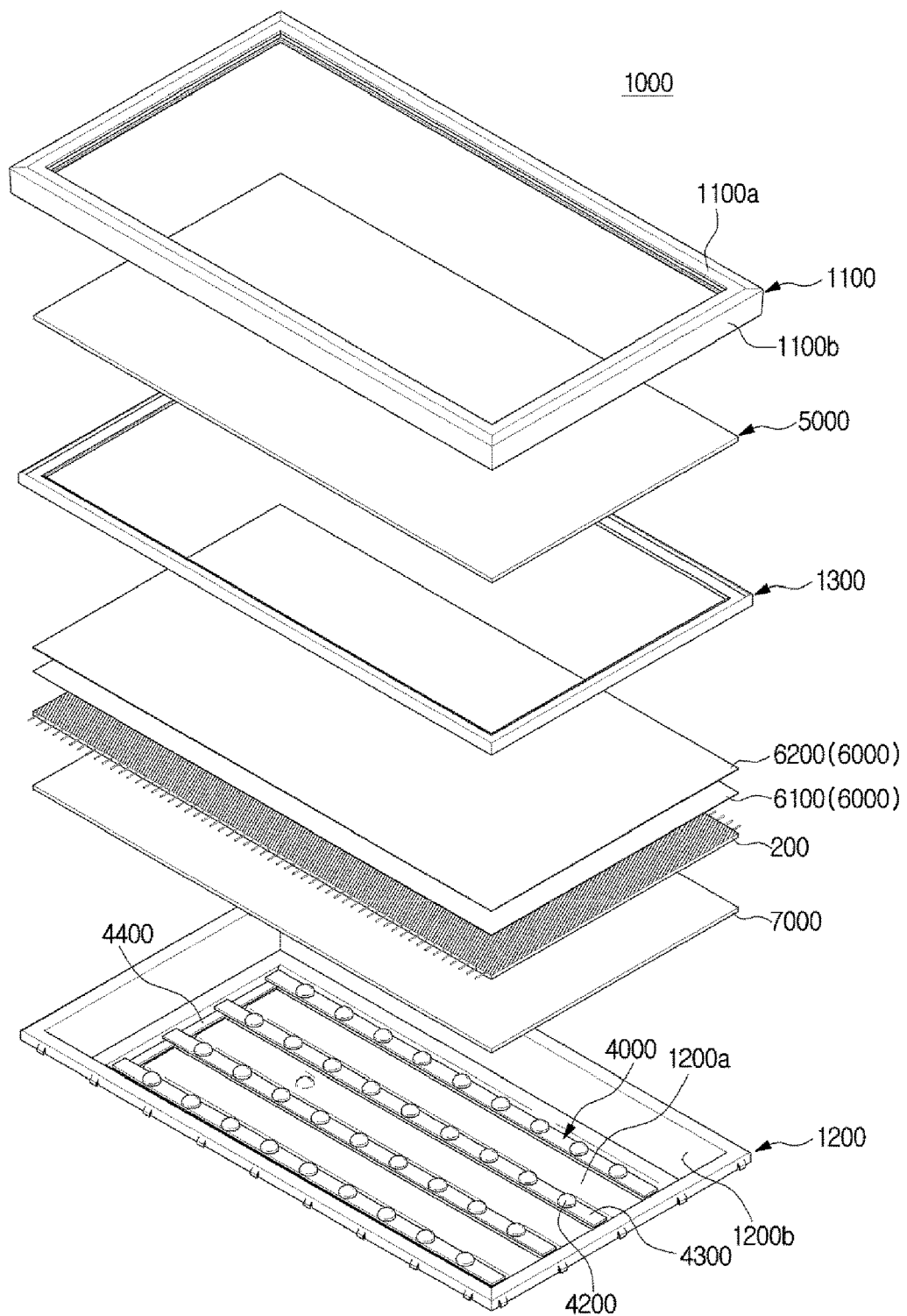
FIG. 25 is an exploded perspective view illustrating a display module of the display apparatus illustrated in FIG. 24.
Figure 26:
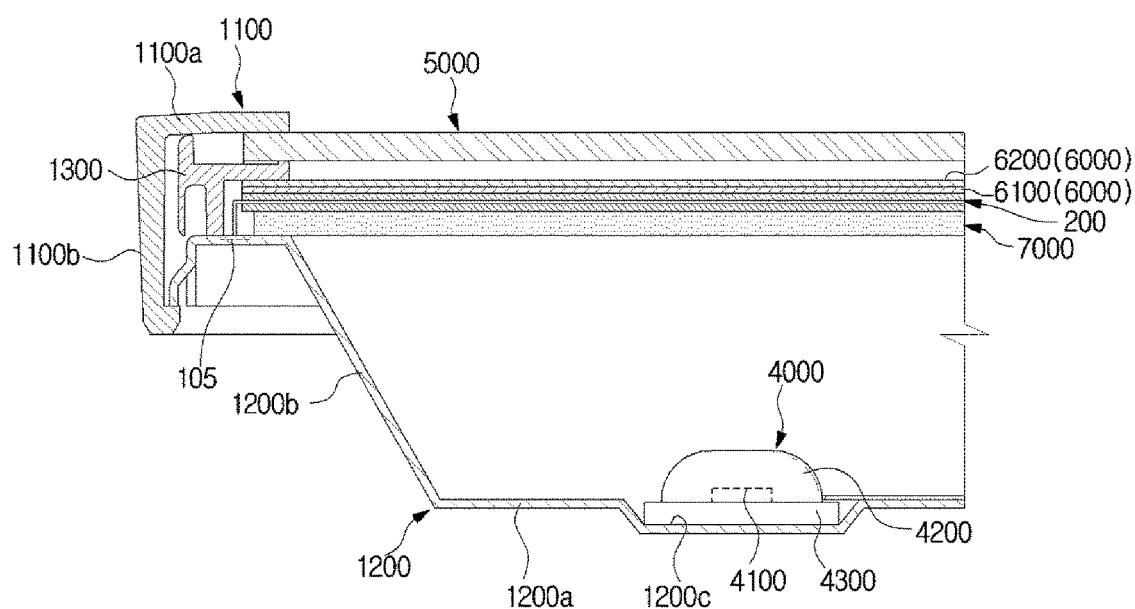
FIG. 26 is a cross-sectional view of the display module of the display apparatus illustrated in FIG. 24.

FIG. 25 is an exploded perspective view illustrating a display module 1000 of the display apparatus 1a illustrated in FIG. 24. FIG. 26 is a cross-sectional view of the display module 1000 of the display apparatus 1a illustrated in FIG. 24.

As illustrated in FIGS. 25 and 26, the display module 1000 may include a top chassis 1100 disposed on the front surface of the display apparatus 1a, a bottom chassis 1200 disposed on the rear surface of the display apparatus 1*a*, and a mold frame 1300 disposed in the display apparatus 1*a*.

The top chassis 1100 is disposed on the same surface of a display panel 5000 that displays an image to prevent edge portions of the display panel 5000 from being exposed to the outside. The top chassis 1100 may include a bezel part 1100*a* to cover front edges of the display panel 5000 and a top side part 1100*b* bent backward from edges of the bezel part 1100*a*.

The bottom chassis 1200 may be disposed on the opposite side of the display panel 5000. In addition, the bottom chassis 1200 may prevent various components included in the display apparatus 1*a* from being exposed to the outside and protect the various components of the display apparatus 1*a* from external impact. A backlight unit 4000 may be installed or provided at the bottom chassis 1200. The bottom chassis 1200 may include a bottom rear part 1200*a* on which the backlight unit 4000 is seated and a bottom side part 1200*b* extending forward from edges of the bottom rear part 1200*a*. The bottom rear part 1200*a* may be provided with a seating groove 1200 recessed such that a circuit board 4300 of the backlight unit 400 is seated thereon.

The mold frame 1300 may be provided to support the display panel 5000 and the diffuser plate 7000. The mold frame 1300 may support the display panel 5000 disposed in front of the mold frame 1300 and the diffuser plate 7000 disposed behind the mold frame 1300. The top chassis 1100 may be installed in front of the mold frame 1300 to maintain the display panel 5000 in a state of being installed at the mold frame 1300. The bottom chassis 1200 may be installed behind the mold frame 1300.

The display module 1000 may include the display panel 5000. Descriptions of the display panel 5000 have already been given above with reference to the display panel 4 of FIGS. 1 and 2 and will not be repeated.

The display module 1000 may further include a backlight unit (BLU) 4000 to supply light to the display panel 5000. The backlight unit 4000 may be disposed behind the display panel 5000 to be spaced apart therefrom.

The backlight unit 4000 may include a plurality of light sources 4100 that generate light. The plurality of light sources 4100 are devices that emit light, and may include, for example, light emitting diodes (LEDs). The plurality of light sources 4100 may be installed on the front surface of the circuit board 4300 to face the diffuser plate 7000. In addition, the plurality of light sources 4100 may emit light toward the display panel 5000.

Furthermore, the backlight unit 4000 may also include a plurality of lenses 4200 respectively surrounding the plurality of light sources 4100. The plurality of lenses 4200 may be installed or provided in the plurality of light sources 4100 respectively to diffuse light generated by the plurality of light sources 4100. The plurality of lenses 4200 may have a circular shape, but the shape of the plurality of lenses 4200 may vary or be modified in one or more other exemplary embodiments. The plurality of lenses 4200 may be implemented using a transparent resin. For example, the plurality of lenses 4200 may be implemented using polycarbonate (PC), polymethyl methacrylate (PMMA), acrylic, or the like. The materials used to form the plurality of lenses 4200 are not limited thereto and various other materials such as glass may also be used therefor.

In addition, the backlight unit 4000 may further include the circuit board 4300 mounted with the plurality of light sources 4100. The circuit board 4300 may include at least one of a printed circuit board and a flexible copper clad laminate.

The circuit board 4300 may be disposed on the bottom chassis 1200. The circuit board 4300 may extend in a direction to correspond to the display panel 5000. The circuit board 4300 may have a conductive pattern. The plurality of light sources 4100 and the circuit board 4300 may be electrically connected to each other by wire bonding, flip chip bonding, or the like.

The backlight unit 4000 may include a plurality of circuit boards 4300 arranged in parallel to each other. The plurality of light sources 4100 and the plurality of lenses 4200 respectively installed or provided in the plurality of light sources 4100 may be arranged to be spaced apart from each other along a lengthwise direction of each of the circuit boards 4300. The plurality of circuit boards 4300 may be connected to each other via a connection substrate 4400.

In addition, the backlight unit 4000 may further include a quantum dot sheet 200 that receives light emitted from the plurality of light sources 4100 and outputs white light (in which various colors are mixed). Here, the quantum dot sheet 200 may include the quantum dot sheets 200, 200*a*, and 200*b* according to the first to third exemplary embodiments. Since the quantum dot sheets 200, 200*a*, and 200*b* according to the first to third exemplary embodiments are described above with reference to FIGS. 13 to 15, redundant descriptions thereof already given above will not be repeated. An arrangement structure of the quantum dot sheet 200 will be described below.

The display module 1000 may further include a diffuser plate 7000 configured to diffuse light emitted from the X-ray detector 400 toward the display panel 5000. The diffuser plate 7000 may be disposed between the display panel 5000 and the plurality of light sources 4100 to guide light toward the display panel 5000 by diffusing light emitted from the plurality of light sources 4100. The diffuser plate 7000 may be disposed behind the display panel 5000.

The display module 1000 may further include an optical sheet 6000 disposed in front of the diffuser plate 7000 to improve optical characteristics of light emitted from the plurality of light sources 4100. The optical sheet 6000 may be disposed above the plurality of light sources 4100. The optical sheet 6000 may include a prism film 6100 to condense light diffused by the diffuser plate 7000 in a direction perpendicular to the display panel 5000. The optical sheet 6000 may further include a protection film 6200 to protect the prism film 6100. The protection film 6200 may be provided on the entire surface of the prism film 6100. The protection film 6200 protects various components of the backlight unit 4000 from external impact or foreign matters. In particular, since the prism film 6100 easily gets scratches, the protection film 6200 may be provided on the entire surface of the prism film 6100 to prevent formation of scratches on the prism film 6100. The optical sheet 6000 may further include a double brightness enhance film. The double brightness enhance film may be disposed on the entire surface of the protection film 6200. The double brightness enhance film is a type of polarizing film and is also referred to as a reflective polarizing film. The double brightness enhance film transmits polarized light parallel to a polarization direction of the double brightness enhance film and reflects polarized light non-parallel to the polarization direction of the double brightness enhance film among light emitted from the backlight unit 4000. In this case, reflected light may be recycled inside the backlight unit 4000 to increase brightness of the display apparatus 1*a*.

Hereinafter, an arrangement structure of the quantum dot sheet 200 according to an exemplary embodiment will be described.

The quantum dot sheet 200 may be disposed to be adjacent to the optical sheet 6000 to convert wavelengths of light emitted from the plurality of light sources 4100. In particular, the quantum dot sheet 200 may be disposed between the optical sheet 6000 and the diffuser plate 7000 to change wavelengths of light emitted from the plurality of light sources 4100. More particularly, the quantum dot sheet 200 may be disposed between the prism film 6100 and the diffuser plate 7000.

Since the quantum dot sheet 200 includes a plurality of wires 104, both ends of each of the plurality of wires 104 may be connected to the connection member 105, and the connection member 105 may be connected to the bottom chassis 1200 or a heat dissipation member for easy connection between the plurality of wires 104 and the bottom chassis 1200 or the heat dissipation member.

As is apparent from the above description, heat of the quantum dot unit may be directly and efficiently dissipated with reasonable manufacturing costs by inserting a metal wire having high thermal conductivity into the hollow of the quantum dot unit including the quantum dots and accommodated in the hollow of the glass fiber.

A display apparatus having excellent heat dissipation performance and a slim design may be realized by inserting a metal wire having high thermal conductivity into the quantum dot sheet serving both as a reflector sheet and a light guide plate.

Although a few exemplary embodiments have been shown and described, it would be appreciated by those skilled in the art that changes may be made in exemplary embodiments without departing from the principles and spirit of the disclosure, the scope of which is defined in the claims and their equivalents.

What is claimed is:

1. A display apparatus comprising:
   a display panel;
   a light source configured to emit light;
   a light guide plate configured to guide the light emitted from the light source toward the display panel;
   a quantum dot unit disposed on a light path between the light source and the display panel and comprising a plurality of quantum dots and at least one wire between the plurality of quantum dots; and
   a chassis configured to support the quantum dot unit,
   wherein both ends of the at least one wire are connected to the chassis, and
   wherein the chassis comprises a heat dissipation member and the both ends of the at least one wire are connected to the heat dissipation member.

2. The display apparatus according to claim 1, wherein the at least one wire comprises a plurality of wires between the plurality of quantum dots.

3. The display apparatus according to claim 1, wherein:
   the light guide plate has a light-incident surface on which light emitted from the light source is incident; and
   the quantum dot unit is between the light-incident surface and the light source.

4. A display apparatus comprising:
   a display panel;
   a light source configured to emit light;
   a light guide plate configured to guide the light emitted from the light source toward the display panel;
   a quantum dot unit disposed on a light path between the light source and the display panel and comprising a plurality of quantum dots and at least one wire between the plurality of quantum dots, wherein:
   the quantum dot unit further comprises a glass fiber having a hollow;
   the plurality of quantum dots is accommodated in the hollow; and
   the at least one wire has a length greater than a length of the glass fiber and extends into the hollow to protrude from both ends of the glass fiber.

5. The display apparatus according to claim 4, wherein the quantum dot unit further comprises a protection layer at the both ends of the glass fiber to prevent the plurality of quantum dots from being exposed.

6. The display apparatus according to claim 4, further comprising a plurality of quantum dot units, including the quantum dot unit, stacked in a thickness direction of the light guide plate.

7. The display apparatus according to claim 6, wherein the plurality of quantum dot units are attached to each other by an adhesive member.

8. The display apparatus according to claim 6, further comprising:
   a printed circuit board mounted with the light source and under the light guide plate in the thickness direction of the light guide plate;
   a middle mold configured to support the display panel, the middle mold comprising an intermediate support part on the light guide plate in the thickness direction of the light guide plate to face the printed circuit board with the light source between the intermediate support part and the printed circuit board; and
   a fixing member comprising:
      a first fixing member at the intermediate support part to fix a first quantum dot unit facing the intermediate support part among the plurality of quantum dot units, and
      a second fixing member installed at the printed circuit board to fix a second quantum dot unit facing the printed circuit board among the plurality of quantum dot units.

9. The display apparatus according to claim 6, further comprising:
   a printed circuit board mounted with the light source and under the light guide plate in the thickness direction of the light guide plate; and
   a middle mold configured to support the display panel, the middle mold comprising an intermediate support part on the light guide plate in the thickness direction of the light guide plate to face the printed circuit board with the light source disposed between the intermediate support part and the printed circuit board,
   wherein at least one of the plurality of quantum dot units is fixed to at least one of the printed circuit board and the intermediate support part.

10. The display apparatus according to claim 6, wherein the plurality of quantum dot units are disposed to be spaced apart respectively from the light guide plate and the light source.

11. The display apparatus according to claim 4, further comprising:
    a plurality of quantum dot units, including the quantum dot unit,
    wherein the plurality of quantum dot units comprises:
       a first quantum dot unit comprising a first quantum dot configured to generate a first color; and
       a plurality of second quantum dot units each comprising a second quantum dot configured to generate a second color different from the first color and arranged along an outer circumference of the first quantum dot unit, and wherein the first quantum dot unit does not include the second quantum dot and the plurality of second quantum dot units do not include the first quantum dot.

12. A display apparatus comprising:
a display panel;
a light source configured to emit light to the display panel;
an optical sheet above the light source;
a quantum dot sheet adjacent to the optical sheet and comprising a plurality of quantum dots and at least one wire between the plurality of quantum dots; and
a chassis configured to support the quantum dot sheet,
wherein both ends of the at least one wire protruding from both ends of the quantum dot sheet are connected to the chassis.

13. The display apparatus according to claim 12, wherein the chassis comprises a heat dissipation member and the both ends of the at least one wire are connected to the heat dissipation member.

14. The display apparatus according to claim 12, further comprising:
a diffuser plate between the display panel and the light source and configured to diffuse the light emitted from the light source and guide the light toward the display panel,
wherein the quantum dot sheet is between the optical sheet and the diffuser plate.

15. The display apparatus according to claim 12, wherein:
the quantum dot sheet further comprises at least one quantum dot unit comprising a glass fiber having a hollow,
the plurality of quantum dots is accommodated in the hollow of the glass fiber, and
the at least one wire is aligned to penetrate the hollow of the glass fiber.

16. The display apparatus according to claim 15, wherein the at least one quantum dot unit further comprises a protection layer at both ends of the glass fiber configured to prevent the plurality of quantum dots from being exposed.

* * * * *